(12) United States Patent
Kondo

(10) Patent No.: US 9,106,026 B2
(45) Date of Patent: Aug. 11, 2015

(54) CONNECTOR

(71) Applicant: Hosiden Corporation, Yao-shi (JP)

(72) Inventor: Hayato Kondo, Yao (JP)

(73) Assignees: HOSIDEN CORPORATION, Yao-shi (JP); FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/520,244

(22) Filed: Oct. 21, 2014

(65) Prior Publication Data
US 2015/0038012 A1 Feb. 5, 2015

Related U.S. Application Data

(62) Division of application No. 13/609,495, filed on Sep. 11, 2012.

(30) Foreign Application Priority Data

Sep. 13, 2011 (JP) .................. 2011-199753

(51) Int. Cl.
H01R 24/00 (2011.01)
H01R 13/6585 (2011.01)
H01R 13/6471 (2011.01)

(52) U.S. Cl.
CPC ........ *H01R 13/6585* (2013.01); *H01R 13/6471* (2013.01); *Y10S 439/941* (2013.01)

(58) Field of Classification Search
CPC .................. H01R 13/6461; H01R 13/6471
USPC .......................... 439/660, 676, 941
See application file for complete search history.

(56) References Cited

U.S. PATENT DOCUMENTS

| 4,070,084 | A | 1/1978 | Hutchison |
| 7,878,816 | B2 | 2/2011 | Zhu |
| 7,909,653 | B1 | 3/2011 | Wan et al. |
| 2011/0294357 | A1 | 12/2011 | Tanaka |

FOREIGN PATENT DOCUMENTS

| JP | 2010-287560 A1 | 12/2010 |
| WO | 2010/092934 A1 | 8/2010 |

OTHER PUBLICATIONS

Extended European Search Report dated Nov. 4, 2014 in the corresponding European patent application No. 12250145.5-1801 / 2571111.

*Primary Examiner* — Khiem Nguyen

(74) *Attorney, Agent, or Firm* — Kratz, Quintos & Hanson, LLP

(57) ABSTRACT

The invention provides a connector including a body of insulating material and first, second, and third signal terminals. The terminals are arranged in a line along a first direction in the body. The third signal terminal is located between the first and second signal terminals. A frequency of a signal transmitted by the third signal terminal is about one hundredth or lower of a frequency of each signal transmitted by the first and second signal terminals.

20 Claims, 13 Drawing Sheets

CONNECTOR

CROSS-REFERENCE TO RELATED APPLICATIONS

This application is a divisional of U.S. application Ser. No. 13/609,495, filed on Sep. 11, 2012. The present application claims priority under 35 U.S.C. §119 of Japanese Patent Application No. 2011-199753 filed on Sep. 13, 2011, the disclosure of which is expressly incorporated by reference herein in its entity.

BACKGROUND OF THE INVENTION

1. Technical Field

The invention relates to connectors having a plurality of terminals.

2. Background Art

Japanese Patent Application Laid-Open No. 2010-287560 discloses a connector including a group of terminals arranged in a line. The terminal group has a plurality of pairs of differential signal terminals and ground terminals. The ground terminals are located between the pairs of the differential signal terminals to prevent crosstalk between the pairs of differential signal terminals.

SUMMARY OF INVENTION

Crosstalk tends to occur in the above conventional connector between the pairs of the differential signal terminals due to narrow pitches between the terminals and/or increased transmission speed of high-frequency signals in the differential signal terminals. One possible solution to prevent such crosstalk is to provide ground terminals between the pairs of differential signal terminals. Unfortunately, the increase in the number of ground terminals will result in upsizing of the connector.

In view of the above problem, the invention provides a connector with reduced crosstalk between signal terminals and decreased size.

A first connector of an aspect of the invention includes a body of insulating material; and first, second, and third signal terminals arranged in a line along a first direction in the body. The third signal terminal is located between the first and second signal terminals. A frequency of a signal transmitted by the third signal terminal is about one hundredth or lower of a frequency of each signal transmitted by the first and second signal terminals.

According to this aspect of the invention, the third signal terminal is located between the first and second signal terminals. As the frequency of a signal transmitted by the third signal terminal is about one hundredth or lower of the frequency of each signal transmitted by the first and second signal terminals, the third signal terminal functions like a ground terminal to a lesser degree but still serves as a pseudo-ground terminal between the first and second signal terminals. Therefore, crosstalk can be reduced between the first and second signal terminals. Further, as the third signal terminal can be used as a terminal for control signaling or for other low-speed signaling in the first connector, the first connector has a reduced size in comparison with a case where a ground terminal is separately provided between the first and second signal terminals.

It is favorable that the third signal terminal include a plurality of third signal terminals located between the first and second signal terminals in the first direction. According to this aspect of the invention, the increased distance between the first and second signal terminals contributes to further reduction of crosstalk between the first and second signal terminals.

A second connector of the invention includes a body of insulating material; and first, second, and third signal terminals and a ground terminal arranged in a line along a first direction in the body. The third signal terminal and the ground terminal are located between the first and second signal terminals. A frequency of a signal transmitted by the third signal terminal is about one tenth or lower of a frequency of each signal transmitted by the first and second signal terminals.

According to this aspect of the invention, the third signal terminal and the ground terminal are located between the first and second signal terminals. As the frequency of a signal transmitted by the third signal terminal is about one tenth or lower of the frequency of each signal transmitted by the first and second signal terminals, the third signal terminal functions like a ground terminal to a lesser degree but still serves as a pseudo-ground terminal between the first and second signal terminals. Therefore, crosstalk can be reduced between the first and second signal terminals. Further, as the third signal terminal can be used as a terminal for control signaling or for other low-speed signaling in the second connector, the second connector has a reduced size in comparison with a case where a plurality of ground terminals are provided between the first and second signal terminals.

The second connector may be provided with at least two ground terminals. In this case, one of the ground terminals may be located between the first and third signal terminals in the first direction, and another ground terminal may be located between the second and third signal terminals in the first direction. Alternatively, the second connector may be provided with at least two third signal terminals. In this case, one of the third signal terminals may be located between the first signal terminal and the ground terminal in the first direction, and another third signal terminal may be located between the second signal terminal and the ground terminal in the first direction.

The second connector may be provided with a pair of first signal terminals arranged adjacent to each other in the first direction. The second connector may be provided with a pair of second signal terminals arranged adjacent to each other in the first direction. The pair of first signal terminals may form a differential pair, and the pair of second signal terminals may form a differential pair.

A third connector of the invention includes a body of insulating material; a fourth signal terminal provided in the body; and fifth and sixth signal terminals arranged in a line along a first direction in the body, at a height position that is different from that of the fourth signal terminal. The sixth signal terminal may be located in a region between the fourth signal terminal and the fifth signal terminal in the first direction. A frequency of a signal transmitted by the sixth signal terminal may be about one tenth or lower of a frequency of a signal transmitted by the fourth signal terminal.

According to this aspect of the invention, the sixth signal terminal is located in a region between the fourth and fifth signal terminals. As the frequency of a signal transmitted by the sixth signal terminal is about one tenth or lower of the frequency of a signal transmitted by the fourth signal terminal, the sixth signal terminal functions like a ground terminal to a lesser degree but still serves as a pseudo-ground terminal between the fourth and fifth signal terminals. Therefore, crosstalk can be reduced between the fourth and fifth signal terminals. Further, as the sixth signal terminal can be used as a terminal for control signaling or for other low-speed signaling in the third connector, the third connector has a reduced size in comparison with a case where a ground terminal is separately provided between the fourth and fifth signal terminals.

The third connector may further include a first ground terminal disposed at the same height position as that of the fifth and sixth signal terminals in the body to be located in the region.

The third connector may further include at least one of a seventh signal terminal and a second ground terminal disposed in the body at the same height position as that of the fourth signal terminal to be located in the region. A frequency of a signal transmitted by the seventh signal terminal may be about one tenth or lower of a frequency of each signal transmitted by the fourth and fifth signal terminals.

According to this aspect of the invention, at least one of the seventh signal terminal and the second ground terminal in addition to the sixth signal terminal is disposed in the region between the fourth and fifth signal terminals. As a frequency of a signal transmitted by the seventh signal terminal is about one tenth or lower of the frequency of each signal transmitted by the fourth and fifth signal terminals, the seventh signal terminal functions like a ground terminal to a lesser degree but still serves as a pseudo-ground terminal between the fourth and fifth signal terminals. Therefore, crosstalk can be further reduced between the fourth and fifth signal terminals. Further, as the seventh signal terminal can be used as a terminal for control signaling or for other low-speed signaling in the third connector, the third connector has a reduced size in comparison with a case where a ground terminal is additionally provided in the region between the fourth and fifth signal terminals.

The third connector may be provided with may be provided with a plurality of sixth signal terminals disposed in the above region. According to this aspect of the invention, the increased distance between the fourth and fifth signal terminals contributes to further reduction of crosstalk between the fourth and fifth signal terminals.

The third connector may further include a third ground terminal or an eighth signal terminal disposed in the body at the same height position as that of the fifth and sixth signal terminals. The third connector may be provided with a pair of fourth signal terminals arranged adjacent to each other in the first direction. The third ground terminal or the eighth signal terminal may be located between the pair of fourth signal terminals in plane position. A frequency of a signal transmitted by the eighth signal terminal may be about one tenth or lower of a frequency of each signal transmitted by the fourth and fifth signal terminals.

According to this aspect of the invention, impedance adjustment between the pair of fourth signal terminals can be performed by locating the third ground terminal or the eighth signal terminal between the pair of fourth signal terminals in plane position. As the frequency of a signal transmitted by the eighth signal terminal is about one tenth or lower of the frequency of each signal transmitted by the fourth and fifth signal terminals, the eighth signal terminal functions like a ground terminal to a lesser degree but still serves as a pseudo-ground terminal located between the fourth signal terminals in plane position.

The third connector may further include a fourth ground terminal or a ninth signal terminal disposed in the body at the same height position as that the fourth signal terminals. The third connector may be provided with a pair of fifth signal terminals arranged adjacent to each other in the first direction. The fourth ground terminal or the ninth signal terminal may be located between the pair of fifth signal terminals in plane position. A frequency of a signal transmitted by the ninth signal terminal may be about one tenth or lower of a frequency of each signal transmitted by the fourth and fifth signal terminals.

According to this aspect of the invention, impedance adjustment between the pair of fifth signal terminals can be performed by locating the fourth ground terminal or the ninth signal terminal between the fifth signal terminals in plane position. As the frequency of a signal transmitted by the ninth signal terminal is about one tenth or lower of the frequency of each signal transmitted by the fourth and fifth signal terminals, the ninth signal terminal functions like a ground terminal to a lesser degree but still serves as a pseudo-ground terminal between the fifth signal terminals in plane position.

The third connector may further include a tenth signal terminal or a fifth ground terminal disposed in the body at the same height position as that of the fifth and sixth signal terminals to be located adjacently to the third ground terminal.

The third connector may further include a third ground terminal or an eighth signal terminal disposed in the body at the same height position as that of the fifth and sixth signal terminals to be located on an opposite side of a portion of the body from the fourth signal terminal and aligned with the fourth signal terminal in a second direction that is perpendicular to the first direction. A frequency of a signal transmitted by the eighth signal terminal may be about one tenth or lower of a frequency of each signal transmitted by the fourth and fifth signal terminals.

According to this aspect of the invention, impedance adjustment of the fourth signal terminal can be performed by locating the third ground terminal or the eighth signal terminal in alignment with the fourth signal terminal in the second direction, with the portion of the body interposed therebetween. As the frequency of a signal transmitted by the eighth signal terminal is about one tenth or lower of the frequency of each signal transmitted by the fourth and fifth signal terminals, the eighth signal terminal functions like a ground terminal to a lesser degree but still serves as a pseudo-ground terminal for the fourth signal terminal.

The third connector may further include a fourth ground terminal or a ninth signal terminal disposed in the body at the same height position as that the fourth signal terminals to be located on an opposite side of the portion of the body from the fifth signal terminal and aligned with the fifth signal terminal in a second direction that is perpendicular to the first direction. A frequency of a signal transmitted by the ninth signal terminal may be about one tenth or lower of a frequency of each signal transmitted by the fourth and fifth signal terminals.

According to this aspect of the invention, impedance adjustment of the fifth signal terminal can be performed by locating the fourth ground terminal or the ninth signal terminal in alignment with the fifth signal terminal in the second direction, with the portion of the body interposed therebetween. As the frequency of a signal transmitted by the ninth signal terminal is about one tenth or less of the frequency of each signal transmitted by the fourth and fifth signal terminals, the ninth signal terminal functions like a ground terminal to a lesser degree but still serves as a pseudo-ground terminal for the fifth signal terminal.

The fourth signal terminal may include a pair of fourth signal terminals arranged adjacent to each other in the first direction. The fifth signal terminal may include a pair of fifth signal terminals arranged adjacent to each other in the first direction. The third ground terminal may include a pair of third ground terminals or the eighth signal terminal may include a pair of eighth signal terminals. The third ground terminals or the eight signal terminals may be located on an opposite side of the portion of the body from the pair of fourth signal terminals and aligned with the fourth signal terminals in a second direction that is perpendicular to the first direction. The fourth ground terminal may include a pair of fourth ground terminals or the ninth signal terminal comprises a pair of ninth signal terminals, the fourth ground terminals or the ninth signal terminals are located on an opposite side of the portion of the body from the pair of fifth signal terminals and aligned with the fifth signal terminals in the second direction.

The third connector may further include a third ground terminal and an eighth signal terminal disposed in the body at the same height position as that of the fifth and sixth signal terminals; and a fourth ground terminal and a ninth signal terminal disposed in the body at the same height position as that of the fourth signal terminal The fourth signal terminal may include a pair of fourth signal terminals arranged adjacent to each other in the first direction. The fifth signal terminal may include a pair of fifth signal terminals arranged adjacent to each other in the first direction. The third ground terminal may be located on an opposite side of a portion of the body from one of the fourth signal terminals and aligned with the one of the fourth signal terminals in a second direction that is perpendicular to the first direction. The eighth signal terminal may be located on an opposite side of the portion of the body from the other fourth signal terminal and aligned with the other fourth signal terminal in the second direction. The fourth ground terminal may be located on an opposite side of the portion of the body from one of the fifth signal terminals and aligned with the one of the fifth signal terminals in the second direction. The ninth signal terminal may be located on an opposite side of the portion of the body from the other fifth signal terminal and aligned with the other fifth signal terminal in the second direction. A frequency of each signal transmitted by the eighth and ninth signal terminals may be about one tenth or lower of a frequency of each signal transmitted by the fourth and fifth signal terminals.

According to this aspect of the invention, the third ground terminal is located in alignment with the one of the fourth signal terminals in the second direction, with the portion of the body interposed therebetween. The eighth signal terminal is located one of the pair of fourth signal terminals in alignment with the other fourth signal terminal in the second direction, with the portion of the body interposed therebetween. The fourth ground terminal is located in alignment with the one of the fifth signal terminals in the second direction, with the portion of the body interposed therebetween. The ninth signal terminal is located in alignment with the other fifth signal terminal in the second direction, with the portion of the body interposed therebetween. This arrangement of the terminals contributes to impedance adjustment of the pairs of the fourth signal terminals and the pair of fifth signal terminals. As the frequency of each signal transmitted by the eighth and ninth signal terminals is about one tenth or lower of the frequency of each signal transmitted by the fourth and fifth signal terminals, the eighth and ninth signal terminals function like ground terminals to lesser degrees but still serve as pseudo-ground terminals for the fourth and fifth signal terminals.

A fourth connector of the invention includes a body of insulating material; a fourth signal terminal provided in the body; a fifth signal terminal and a plurality of sixth signal terminals arranged in a line along a first direction in the body, at a height position that is different from that of the fourth signal terminal. At least two of the sixth signal terminals are adjacent to each other in the first direction. The fourth signal terminal is located in plane position between the two sixth signal terminals in the first direction. A frequency of each signal transmitted by the sixth signal terminals is about one tenth or lower of a frequency of a signal transmitted by the fourth signal terminal.

According to this aspect of the invention, the fourth signal terminal is located in plane position between two of the sixth signal terminals that are adjacent to each other in the first direction. In other words, there is a sixth signal terminal on either side in plane position of the fourth signal terminal in the first direction. As the frequency of each signal transmitted by the sixth signal terminals is about one tenth or lower of the frequency of a signal transmitted by the fourth signal terminal, the sixth signal terminals function like ground terminals to lesser degrees but still serve as pseudo-ground terminals. Therefore, these sixth signal terminals contribute to reduction of crosstalk between the fourth signal terminal and the fifth signal terminal in the same terminal line as that of the sixth signal terminals. Further, as the sixth signal terminals can be used as terminals for control signaling or for other low-speed signaling in the fourth connector, the fourth connector has a reduced size in comparison with a case where ground terminal are provided on both sides in plane position of the fourth signal terminal in the first direction.

The fourth connector may be provided with a pair of fifth signal terminals adjacent to each other in the first direction.

A fifth connector of the invention includes a body of insulating material; a fourth signal terminal provided in the body; and a fifth signal terminal, a sixth signal terminal, and a ground terminal. The fifth and sixth signal terminals and the ground terminal are arranged in a line along a first direction in the body, at a height position that is different from that of the fourth signal terminal. The sixth signal terminal and the ground terminal are adjacent to each other in the first direction. The fourth signal terminal is located in plane position between the sixth signal terminal and the ground terminal A frequency of a signal transmitted by the sixth signal terminal is about one tenth or lower of a frequency of a signal transmitted by the fourth signal terminal.

According to this aspect of the invention, the sixth signal terminal and the ground terminal are adjacent to each other in the first direction and the fourth signal terminal is located in plane position between the sixth signal terminal and the ground terminal. In other words, the sixth signal terminal and the ground terminal are located on opposite sides in plane position of the fourth signal terminal in the first direction. The frequency of a signal transmitted by the sixth signal terminal is about one tenth or lower of the frequency of a signal transmitted by the fourth signal terminal. Therefore, the sixth signal terminal functions like a ground terminal to a lesser degree but still serves as a pseudo-ground terminal on a side in plane position of the fourth signal terminal in the first direction. On the other side in plane position of the fourth signal terminal in the first direction, there is a ground terminal. Therefore, crosstalk can be reduced between the fourth signal terminal and the fifth signal terminal in the same terminal line as that of the sixth signal terminal and the ground terminal. Further, as the sixth signal terminal can be used as a terminal for control signaling or for other low-speed signaling in the fifth connector, the fifth connector has a reduced size in comparison with a case where ground terminals are provided on both sides in plane position of the fourth signal terminal in the first direction.

The fourth connector may be provided with a pair of fourth signal terminals arranged adjacent to each other in the first direction. The fifth connector may be provided with at least two six signal terminals, or alternatively at least two ground terminals, or alternatively at least two six signal terminals and at least two ground terminals. One of the fourth signal terminals may be located in plane position between the sixth signal terminal and the ground terminal that are adjacent to each other, and the other fourth signal terminal may be located in plane position between two of the sixth signal terminals that are adjacent to each other or two of the ground terminals that are adjacent to each other.

A sixth connector of the invention includes a body of insulating material; a fourth signal terminal provided in the body; and fifth and sixth signal terminals arranged in a line along a first direction in the body, at a height position that is different from that of the fourth signal terminal. The fourth signal terminal is located on an opposite side of a portion of the body from the sixth signal terminal and aligned with the sixth signal terminal in a second direction that is perpendicular to the first direction. A frequency of a signal transmitted by the sixth signal terminal is about one tenth or lower of a frequency of a signal transmitted by the fourth signal terminal.

According to this aspect of the invention, the fourth signal terminal is located in alignment with the sixth signal terminal in the second direction, with the portion of the body interposed therebetween. As the frequency of a signal transmitted by the sixth signal terminal is about one tenth or less of the frequency of a signal transmitted by the fourth signal terminal. Therefore, the sixth signal terminal functions like a ground terminal to a lesser degree but still serves as a pseudo-ground terminal. As a result, crosstalk can be reduced between the fourth signal terminal and the fifth signal terminal in the same terminal line as that of the sixth signal terminal. Further, as the sixth signal terminal can be used as a terminal for control signaling or for other low-speed signaling in the sixth connector, the sixth connector has a reduced size in comparison with a case where a ground terminal is provided in alignment with the fourth signal terminal in the second direction, with the portion of the body interposed therebetween.

The sixth connector may be provided with a pair of fourth signal terminals adjacent to each other in the first direction. The sixth connector may be provided with a pair of sixth signal terminals. The fourth signal terminals may be located on an opposite side of the portion of the body from the sixth signal terminals and aligned with the sixth signal terminals in the second direction.

The sixth connector may further include a ground terminal disposed in the body at the same height position as that of the fifth and sixth signal terminals. The sixth connector may be provided with a pair of fourth signal terminals adjacent to each other in the first direction. One of the fourth signal terminals may be located on an opposite side of the portion of the body from the sixth signal terminal and aligned with the sixth signal terminal in the second direction. The other fourth signal terminal may be located on an opposite side of the portion of the body from the ground terminal and aligned with the ground terminal in the second direction.

The sixth connector may be provided with a pair of fifth signal terminals adjacent to each other in the first direction. The pair of fourth signal terminals may form a differential pair. The pair of fifth signal terminals may form a differential pair.

DESCRIPTION OF EMBODIMENTS

Connectors according to Embodiments 1 to 5 of the invention will be described below.

Embodiment 1

Figure 1:
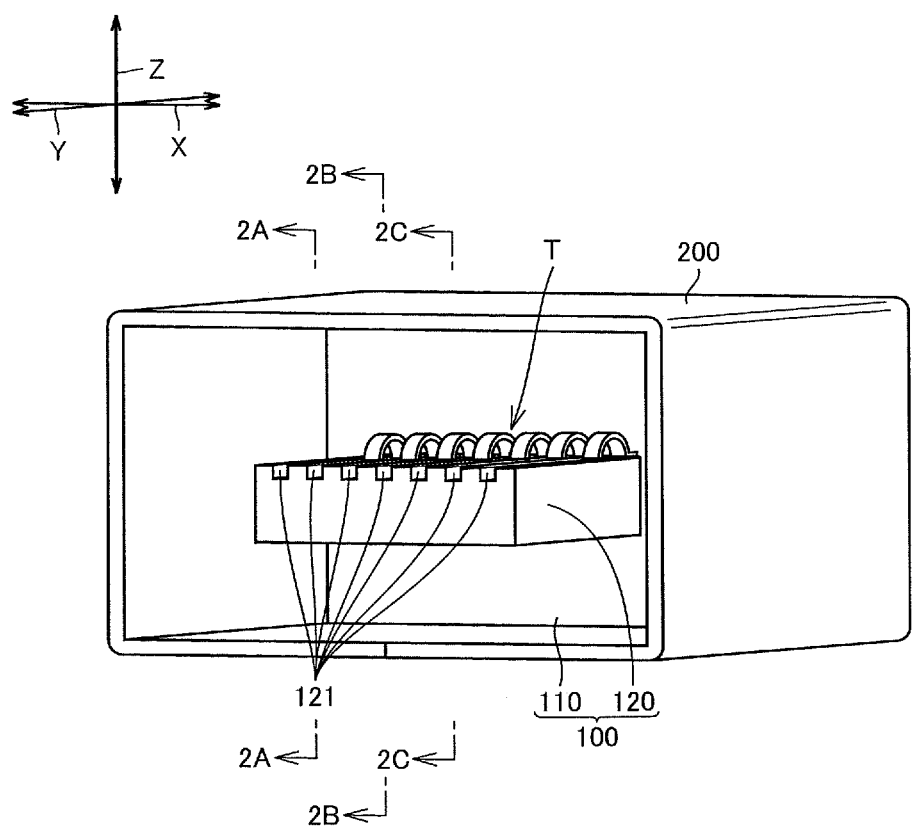
FIG. 1 is a schematic front, top and right side perspective view of a connector according to Embodiment 1 of the invention.

The connector according to Embodiment 1 of the invention will be described with reference to FIGS. 1 to 3. The connector shown in FIG. 1 is a receptacle for mounting onto a circuit board (not shown) and receiving a plug (not shown). The connector includes a body 100, a shell 200, and a terminal group T. Each component of the connector will be described in detail below. It should be noted that in FIGS. 1 to 2C, "X" refers to a widthwise direction of the connector and an arrangement direction of terminals in the terminal group T (a first direction), "Y" refers to a front-back direction of the connector, and "Z" refers to a heightwise direction of the connector (a second direction). The Y direction is orthogonal to the X direction, and the Z direction is orthogonal to the X and Y directions.

Figure 2A:
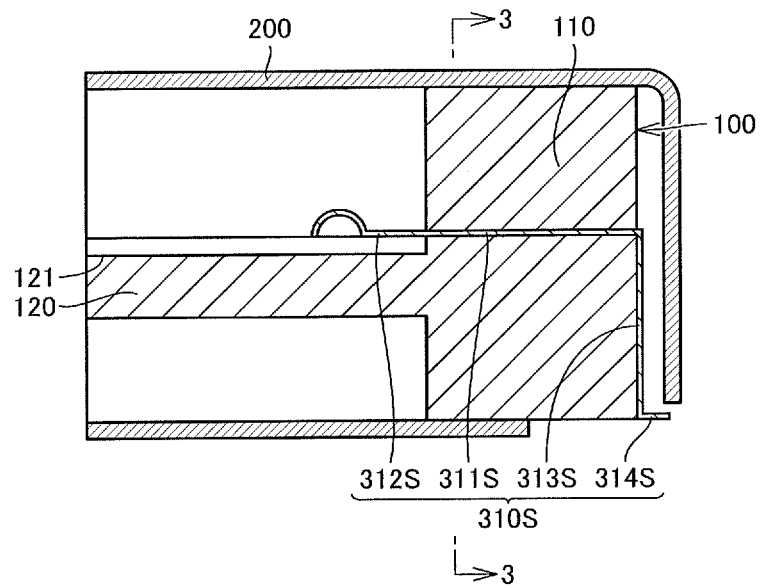
FIG. 2A is a cross-sectional view of the connector taken along line 2A-2A in FIG. 1.
Figure 2B:
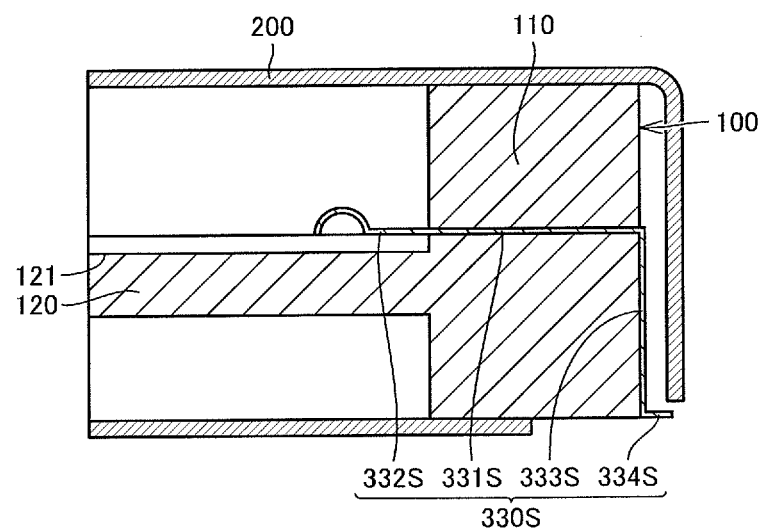
FIG. 2B a cross-sectional view of the connector taken along line 2B-2B in FIG. 1.

The body 100 is an injection molded member of insulating resin. The body 100 includes a main body 110 and a projection 120 as shown in FIGS. 2A to 2C. The main body 110 is of rectangular shape. The projection 120 is a rectangular plate provided centrally of a first face in the Y direction (front face) of the main body 110 and extends in the Y direction. A first face in the Z direction (upper face) of the projection 120 is provided with a plurality of grooves 121 extending in the Y direction. The grooves 121 are arrayed at intervals along the X direction.

The shell 200 is a square tube formed of an electrically conductive metal plate and surrounds the outer circumference of the body 100.

Figure 3:
FIG. 3 is an end view of terminals of the connector taken along line 3-3 in FIG. 2A.

The terminal group T, as shown in FIG. 3, includes a pair of first signal terminals 310S, a pair of second signal terminals 320S, and two pieces of third signal terminals 330S.

The first signal terminals 310S are electrically conductive metal plates extending in the Y direction as shown in FIG. 2. The first signal terminals 310S each include a middle portion 311S, a contact portion 312S, a hanging portion 313S, and a tail portion 314S. The middle portion 311S is a plate extending in the Y direction and is securely embedded in the main body 110 of the body 100. The middle portion 311S has first and second ends in the Y direction. The contact portion 312S is a plate continuous with the first end of the middle portion 311S and extends in the Y direction. The contact portion 312S is received in a groove 121 in the projection 120 of the body 100. A tip of the contact portion 312S forms a bend of an upward-convex arc shape in the Z direction. The bend is adapted to contact a signal contact of the plug.

The hanging portion 313S is a generally L-shaped plate continuous with the second end of the middle portion 311S and is bent at a right angle to the middle portion 311S to extend in the Z direction along a second face in the Y direction (rear face) of the main body 110. The tail portion 314S is a plate continuous with a lower end in the Z direction of the hanging portion 313S and is bent at a right angle to the hanging portion 313S to extend in the Y direction. The tail portion 314S is connectable to a signal line of the circuit board.

Figure 2C:
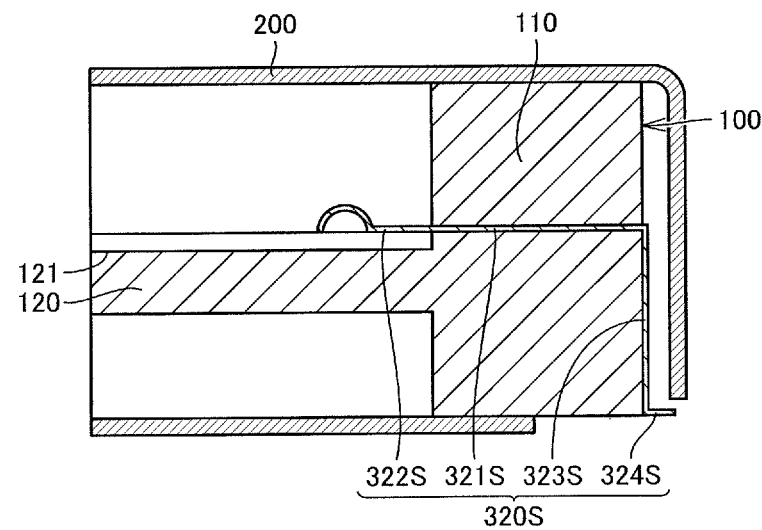
FIG. 2C is a cross-sectional view of the connector taken along line 2C-2C in FIG. 1.

The second signal terminals 320S are electrically conductive metal plates extending in the Y direction as shown in FIG. 2C and are of the same shape as that of the first signal terminals 310S. The second signal terminals 320S each include a middle portion 321S, a contact portion 322S, a hanging portion 323S, and a tail portion 324S. As these portions of the second signal terminal 320S are of the same configurations as those of the first signal terminal 310S, no further description will be given.

The third signal terminals 330S are electrically conductive metal plates extending in the Y direction as shown in FIG. 2C and are of the same shape as that of the first signal terminal 310S. The third signal terminals 330S each include a middle portion 331S, a contact portion 332S, a hanging portion 333S, and a tail portion 334S. As these portions of the third signal terminal 330S are of the same configurations as those of the first signal terminal 310S, no further description will be given.

As shown in FIG. 3, the terminal group T is arranged in a line at intervals along the X direction in the body 100, particularly in the order of 310S, 310S, 330S, 330S, 320S and 320S (i.e., the terminals of the terminal group T are arranged in a line along the X direction in the body 100). The pair of first signal terminals 310S is adjacent to each other in the X direction and forms a differential pair for high-speed differential signaling. The pair of second signal terminals 320S is adjacent to each other in the X direction and forms a differential pair for high-speed differential signaling. The two pieces of third signal terminals 330S are arranged at an interval along the X direction to be located between one of the pair of first signal terminals 310S and one of the pair of second signal terminals 320S as shown in FIG. 3.

It should be noted that a frequency of a signal transmitted by the third signal terminals 330S is about one hundredth or lower of a frequency of a high-speed differential signal transmitted by the first and second signal terminals 310S and 320S. For example, the pair of first signal terminals 310S may transmit high-speed differential signals at a frequency of several gigahertz (GHz), the pair of second signal terminals 320S may transmit high-speed differential signals also at a frequency of several GHz, and the third signal terminals 330S may transmit high-speed differential signals at a frequency of several megahertz (MHz). Alternatively, the pair of first signal terminals 310S may transmit high-speed differential signals at a frequency of several GHz, the pair of second signal terminals 320S may transmit high-speed differential signals also at a frequency of several GHz, and the third signal terminals 330S may transmit high-speed differential signals at a frequency of tens of MHz. This configuration makes it possible to use the third signal terminals 330S as pseudo-ground terminals between the pair of first signal terminals 310S and the pair of second signal terminals 320S in signal transmission. It should also be noted that the third signal terminals 330S exert a signal shielding function (crosstalk reducing function) to lesser degrees than genuine ground terminals.

The connector configured as described above may be manufactured in the following steps. The first step is to prepare an electrically conductive metal plate. The metal plate is press-formed using a die into the first, second, and third signal terminals 310S, 320S and 330S.

The next step is to injection-mold an insulating resin to form the body 100. In the injection-molding, the middle portions 311S of the first signal terminals 310S, the middle portions 321S of the second signal terminal 320S and the middle portions 331S of the third signal terminals 330S are insert-molded in the main body 110. As a result, the first, second, and third signal terminals are arranged in a line along the X direction in the body 100, in the order of 310S, 310S, 330S, 330S, 320S and 320S.

Thereafter, the body 100 is inserted into the shell 200. The connector is now assembled and is ready to mount onto the circuit board. When mounting the connector, the tail portions 314S, 324S and 334S are soldered to the signal lines of the circuit board.

The above-described connector has many advantageous features. Particularly, the two pieces of third signal terminals 330S are arranged at an interval between the first signal terminal 310S and the second signal terminal 320S. As the frequency of each signal transmitted by the third signal terminals 330S is about one hundredth or lower of the frequency of each high-speed differential signal transmitted by the first and second signal terminals 310S and 320S, the third signal terminals 330S serve as pseudo-ground terminals between the pair of first signal terminals 310S and the pair of second signal terminals 320S in signal transmission. Therefore, it is possible to reduce crosstalk between differential signals transmitted by the pair of first signal terminals 310S and differential signals transmitted by the pair of second signal terminals 320S. Also, the third signal terminals 330S can be used as terminals for control signaling or for other low-speed signaling in the connector. Therefore, the connector has a reduced X-direction dimension, i.e. a reduced size in comparison with a case where ground terminals are separately provided between the first and second signal terminals 310S and 320S.

Embodiment 2

Figure 4:
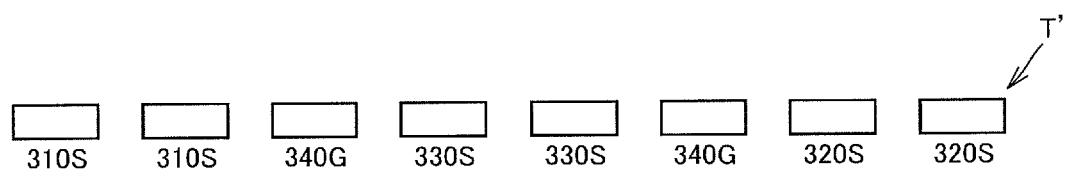
FIG. 4 is an end view of a terminal layout example of a terminal group of a connector according to Embodiment 2 of the invention.
Figure 5:
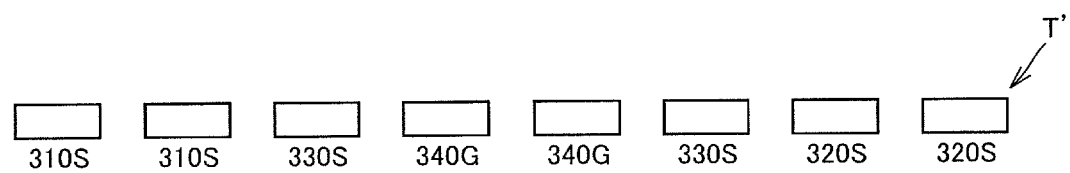
FIG. 5 is an end view of another terminal layout example of the terminal group of the connector.

A connector according to Embodiment 2 of the invention will be described below with reference to FIG. 4 or FIG. 5. The connector shown in FIG. 4 or FIG. 5 is configured almost the same as the connector of the Embodiment 1 except a terminal group of different configuration from the terminal group T. Therefore, the terminal group T' will be described in detail and the descriptions of the other components of connector overlapping with the Embodiment 1 will be omitted. The terminal group of the connector of the Embodiment 2 will be referred to with a symbol _'_for the sake of distinction from the terminal group T of the Embodiment 1.

The terminal group T' includes a pair of first signal terminals 310S, a pair of second signal terminals 320S, two pieces of third signal terminals 330S, and two ground terminals 340G. The first, second, and third signal terminals 310S, 320S and 330S are the same ones as those of Embodiment 1. The ground terminals 340G are conductive metal plates extending in the Y direction and have the same configuration as that of the first signal terminal 310S. More particularly, the ground terminals 340G each have a middle portion, a contact portion, a hanging portion, and a tail portion. The tail portions of the ground terminals 340G are connectable to a ground line of the circuit board. The respective portions of the ground terminals 340G will not be described further to avoid the redundancies with the first signal terminals 310S.

The terminal group T' is arranged in a line at intervals along the X direction in the body 100, particularly in the order of 310S, 310S, 340G, 330S, 330S, 340G, 320S and 320S as shown in FIG. 4, or in the order of the terminals 310S, 310S, 330S, 340G, 340G, 330S, 320S and 320S as shown in FIG. 5. In either terminal layout, the two ground terminals 340G and the two third signal terminals 330S are arranged in a line at intervals along the X direction between one of the pair of first signal terminals 310S and one of the pair of second signal terminals 320S. In the layout as shown in FIG. 4, one of the ground terminals 340G is located between the third signal terminals 330S and the first signal terminals 310S in the X direction, and the other ground terminals 340G is located between the third signal terminal 330S and the second signal terminal 320S in the X direction. In the layout as shown in FIG. 5, one of the third signal terminals 330S is located between the ground terminals 340G and the first signal terminals 310S in the X direction, and the other third signal terminal 330S is located between the ground terminals 340G and the second signal terminals 320S in the X direction.

A frequency of each signal transmitted by the third signal terminals 330S is about one tenth or lower of a frequency of each high-speed differential signal transmitted by the first and second signal terminals 310S and 320S. For example, the pair of first signal terminals 310S may transmit high-speed differential signals at a frequency of several GHz to ten-odd GHz, the pair of second signal terminals 320S may transmit high-speed differential signals also at a frequency of several GHz to ten-odd GHz, and the third signal terminals 330S may transmit signals at a frequency of a few hundred MHz to about one GHz. This configuration makes it possible to use the third signal terminals 330S as pseudo-ground terminals between the pair of first signal terminals 310S and the pair of second signal terminals 320S in signal transmission.

The above-described connector has many advantageous features. Particularly, the two pieces of third signal terminals 330S and the two ground terminals 340G are arranged at intervals between the first signal terminal 310S and the second signal terminal 320S. As the frequency of each signal transmitted by the third signal terminals 330S is about one tenth or lower of the frequency of each high-speed differential signal transmitted by the first and second signal terminals 310S and 320S, the third signal terminals 330S serve as pseudo-ground terminals between the pair of first signal terminals 310S and the pair of second signal terminals 320S in signal transmission. Therefore, it is possible to reduce crosstalk between differential signals transmitted by the pair of first signal terminals 310S and differential signals transmitted by the pair of second signal terminals 320S. Also, the third signal terminals 330S can be used as terminals for control signaling or for other low-speed signaling in the connector. Therefore, the connector has a reduced X-direction dimension, i.e. a reduced size in comparison with a case where ground terminals are separately provided between the first and second signal terminals 310S and 320S.

Embodiment 3

Figure 6:
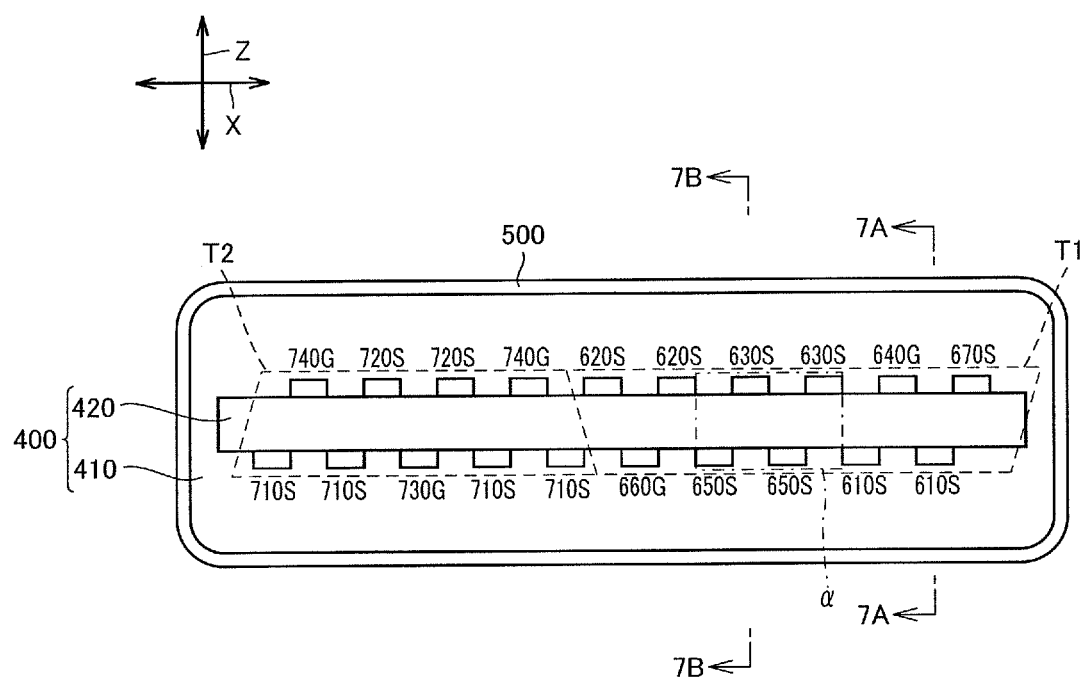
FIG. 6 is a schematic front view of the connector according to Embodiment 3 of the invention.

A connector according to Embodiment 3 of the invention will be described below with reference to FIGS. 6 to 7B. The connector shown in FIG. 6 is a receptacle for mounting onto a circuit board (not shown) and receiving a plug (not shown). The connector includes a body 400, a shell 500, and terminal groups T1 and T2. Each component of the connector will be described in detail below. It should be noted that in FIGS. 6 to 7B, "X" refers to a widthwise direction of the connector and an arrangement direction of terminal groups T1 and T2 (the first direction), "Y" refers to a front-back direction of the connector, and "Z" refers to a heightwise direction of the connector (a second direction). The Y direction is orthogonal to the X direction, and the Z direction is orthogonal to the X and Y directions.

Figure 7A:
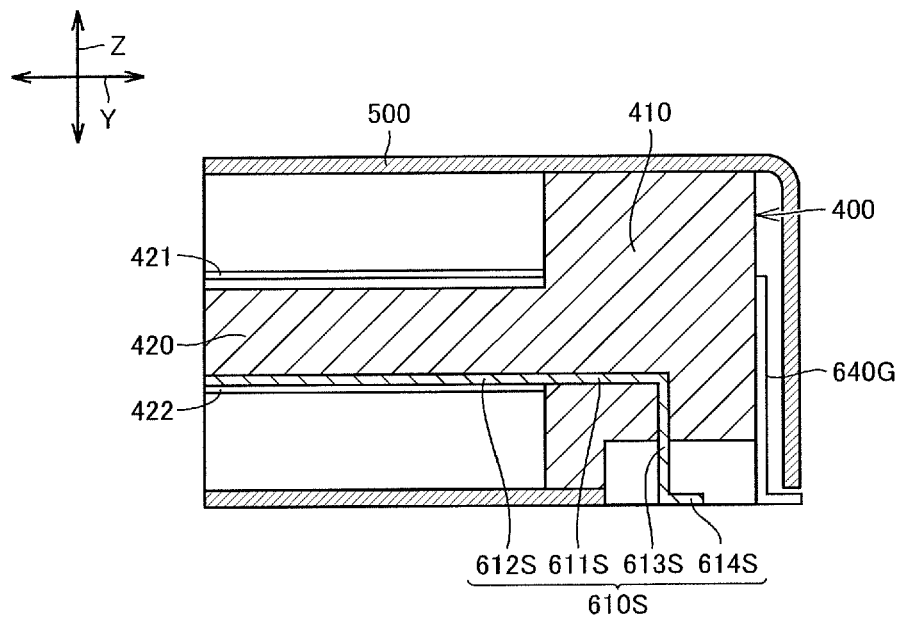
FIG. 7A is a cross-sectional view of the connector taken along line 7A-7A in FIG. 6.

The body 400 is an injection molded member of insulating resin. The body 400 includes a main body 410 and a projection 420 as shown in FIG. 7A and FIG. 7B. The main body 410 is of a rectangular shape. The projection 420 is a rectangular plate provided centrally of a first face in the Y direction (front face) of the main body 410 and extends in the Y direction. A first face in the Z direction (upper face) of the projection 420 is provided with a plurality of grooves 421 extending in the Y direction. The grooves 421 are arrayed at intervals along the X direction. A second face in the Z direction (lower face) of the projection 420 is provided with a plurality of grooves 422 extending in the Y direction. The grooves 422 are arrayed at intervals along the X direction. The grooves 421 and 422 form a zigzag layout along the X direction.

The shell 500 is a square tube including a conductive metal plate and surrounds the outer circumference of the body 400.

The terminal groups T1 and T2 are compliant with different standards. For example, the terminal groups T1 and T2 may be compliant with any of High-Definition Multimedia Interface (HDMI) standard, Universal Serial Bus (USB) 3.0 standard and DisplayPort standard. The terminal groups T1 and T2 of the Embodiment 3 will be described below without specifying which standards they are compliant with.

As shown in FIG. 6, the terminal group T1 includes a plurality of fourth signal terminals 610S, a plurality of fifth signal terminals 620S, a plurality of sixth signal terminals 630S, a ground terminal 640G (third ground terminal), a plurality of seventh signal terminals 650S, a ground terminal 660G (fourth ground terminal), and a tenth signal terminal 670S.

The fourth signal terminals 610S are electrically conductive metal plates extending in the Y direction as shown in FIG. 7A. The fourth signal terminals 610S each include a middle portion 611S, a contact portion 612S, a hanging portion 613S, and a tail portion 614S. The middle portion 611S is a plate extending in the Y direction and securely embedded in the main body 410 of the body 400. The middle portion 611S has first and second ends in the Y direction. The contact portion 612S is a plate continuous with the first end of the middle portion 611S and extends in the Y direction. The contact portion 6125 is received in a groove 422 of the projection 420 of the body 400 and is adapted to contact a signal contact of the plug.

The hanging portion 613S is a generally L-shaped plate continuous with the second end of the middle portion 611S and is bent at a right angle to the middle portion 611S to extend in the Z direction. The tail portion 6145 is a plate continuous with a lower end of the hanging portion 613S in the Z direction and is bent at a right angle to the hanging portion 613S to extend in the Y direction. The tail portion 614S is connectable to a signal line of the circuit board.

The seventh signal terminals 650S and the ground terminal 660G are electrically conductive metal plates extending in the Y direction and have the same shape as that of the fourth signal terminals 610S. The seventh signal terminals 650S and the ground terminal 660G each include a middle portion, a contact portion, a hanging portion, and a tail portion. The tail portions of the seventh signal terminals 650S are connectable to associated signal lines of the circuit board. The tail portion of the ground terminal 660G is connectable to a ground line of the circuit board. The respective portions of the seventh signal terminals 650S and the ground terminal 660G will not be described because they have the same configurations as those of the fourth signal terminals 610S.

Figure 7B:
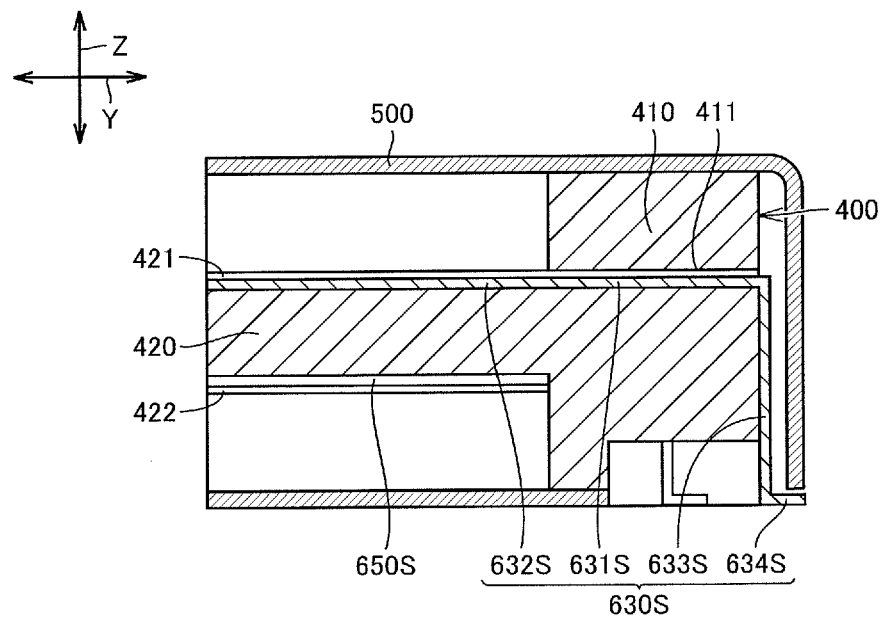
FIG. 7B is a cross-sectional view of the connector taken along line 7B-7B in FIG. 6.

The sixth signal terminals 630S are electrically conductive metal plates extending in the Y direction as shown in FIG. 7B. The sixth signal terminals 630S each include a middle portion 6315, a contact portion 632S, a hanging portion 633S, and a tail portion 634S. The middle portion 631S is a plate extending in the Y direction to be securely pressed into a through hole 411 in the main body portion 410 of the body 400. The middle portion 631S has first and second ends in the Y direction. The contact portion 632S is a plate continuous with the first end of the middle portion 631S and extends in the Y direction. The contact portion 632S is received in a groove 421 of the projection 420 in the body 400 and is contactable with an associated signal contact of the plug.

The hanging portion 633S is a generally L-shaped plate continuous with the second end of the middle portion 631S and is bent at a right angle to the middle portion 631S. The hanging portion 633S extends in the Z direction along a second face in the Y direction (rear face) of the main body portion 410. The hanging portion 633S has a larger dimension in the Z direction than a dimension in the Z direction of the hanging portion 613S. The tail portion 634S is a plate continuous with a lower end in the Z direction of the hanging portion 633S and is bent at a right angle to the hanging portion 633S to extend in the Y direction. The tail portion 634S is connectable to an associated signal line of the circuit board.

The fifth signal terminals 620S, the ground terminal 640G and the tenth signal terminal 670S are electrically conductive metal plates extending in the Y direction and have the same shape as the sixth signal terminals 630S. The fifth signal terminals 620S, the ground terminal 640G and the tenth signal terminal 670S each include a middle portion, a contact portion, a hanging portion, and a tail portion. The tail portions of the fifth signal terminals 620S and the tenth signal terminal 670S are connectable to associated signal lines of the circuit board. The tail portion of the ground terminal 640G is connectable to the ground line of the circuit board. The respective portions of the respective fifth signal terminals 620S, the ground terminal 640G and the tenth signal terminal 670S will not be described because they have the same configurations as those of the sixth signal terminals 630S.

The terminals of the terminal group T1 are arranged in two lines to form a zigzag layout as shown in FIG. 6. More particularly, the terminals in the first line (upper row) are arranged at intervals along the X direction in the body 400, in the order of 620S, 620S, 630S, 630S, 6400 and 670S, while the terminals in the second line (lower row) are arranged at intervals along the X direction in the body 400, in the order of 660G, 650S, 650S, 610S, and 610S. The pair of fourth signal terminals 610S is adjacent to each other in the X direction and forms a differential pair for high-speed differential signaling. The pair of fifth signal terminals 620S is adjacent to each other in the X direction and forms a differential pair for high-speed differential signaling. The sixth signal terminals 630S and the seventh signal terminals 650S are arranged at intervals along the X direction to be located in a region α between the fourth signal terminals 610S and the fifth signal terminals 620S in the X direction.

The ground terminal 640G is located between the pair of fourth signal terminals 610S in plane position. The ground terminal 660G is located between the pair of fifth signal terminals 620S in plane position. The tenth signal terminal 670S is located at the very end of the terminal group T1 and adjacent to the ground terminal 640G.

It should be noted that a frequency of each signal transmitted by the sixth, seventh and tenth signal terminals 630S, 650S and 670S are about one tenth or lower of a frequency of each high-speed differential signal transmitted by the fourth and fifth signal terminals 610S and 620S. For example, the pair of fourth signal terminals 610S may transmit high-speed differential signals at a frequency of several GHz to ten-odd GHz, the pair of fifth signal terminals 620S may transmit high-speed differential signals also at a frequency of several GHz to ten-odd GHz, and the sixth, seventh and tenth signal terminals 630S, 650S and 670S may transmit signals at a frequency of a few hundred MHz to about one GHz. This configuration makes it possible to use the sixth signal terminals 630S and the seventh signal terminals 650S as pseudo-ground terminals in the region α between the fourth signal terminals 610S and the fifth signal terminals 620S in signal transmission. It should also be noted that the sixth and seventh signal terminals 630S and 650S exert a signal shielding function (crosstalk reducing function) to lesser degrees than genuine ground terminals.

The terminal group T2 includes a plurality of signal terminals 710S, a plurality of signal terminals 720S, and a plurality of ground terminals 730G and 740G. The terminals of the terminal group T2 are arranged in two lines along the X direction to form a zigzag layout. More particularly, the terminals in the first line (upper row) are arranged at intervals along the X direction in the body 400, in the order of 740G, 720S, 720S and 740G. The terminals in the second line (lower row) are arranged at intervals along the X direction in the body 400, in the order of 710S, 710S, 730G, 710S and 710S.

The signal terminals 720S and the ground terminals 740G are electrically conductive metal plates extending in the Y direction and each have the same shape as that of the sixth signal terminals 630S. The signal terminals 720S and the ground terminals 740G each include a middle portion, a contact portion, a hanging portion, and a tail portion. The respective portions of the signal terminals 720S and the ground terminals 740G will not be described because they have the same configurations as those of the sixth signal terminals 630S.

The signal terminals 710S and the ground terminal 730G are electrically conductive metal plates extending in the Y direction and each have the same shape as that of the fourth signal terminals 610S. The signal terminal 710S and the ground terminal 730G each include a middle portion, a contact portion, a hanging portion, and a tail portion. The respective portions of the signal terminal 710S and the ground terminal 730G will not be described because they have the same configurations as those of the fourth signal terminals 610S.

The signal terminals 710S form two differential pairs for high-speed differential signaling, and the terminals of each pair are adjacent to each other in the X direction. The signal terminals 720S form a differential pair for high-speed differential signaling and adjacent to each other in the X direction. The ground terminal 730G is located between the pairs of signal terminals 720S in plane position. The ground terminals 740G are each located between the terminals of each pair of signal terminals 710S in plane position.

The above-described connector has many advantageous features. Particularly, in the terminal group T1, the sixth and seventh signal terminals 630S and 650S are located in the region α between the fourth signal terminals 610S and the fifth signal terminals 620S in the X direction. The frequency of each signal transmitted by the sixth and seventh signal terminals 630S and 650S are about one tenth or lower of the frequency of each high-speed differential signal transmitted by the fourth and fifth signal terminals 610S and 620S. This configuration makes it possible to use the sixth and seventh signal terminals 630S and 650S as pseudo-ground terminals in the region α in signal transmission. Therefore, it is possible to reduce crosstalk between the differential signals transmitted by the pair of fourth signal terminals 610S and the differential signals transmitted by the pair of fifth signal terminals 620S. Also, the sixth and seventh signal terminals 630S and 650S can be used as terminals for control signaling or for other low-speed signaling in the connector. Therefore, the connector has a reduced X-direction dimension, i.e. a reduced size in comparison with a case where ground terminals are separately provided in the region α.

Further advantageously, the ground terminal 640G is located between the pair of fourth signal terminals 610S in plane position. This arrangement makes it possible to adjust impedance between the pair of fourth signal terminals 610S, improving transmission characteristics of the differential signals transmitted by the fourth signal terminals 610S. Similarly, the ground terminal 660G is located between the pair of fifth signal terminals 620S in plane position. This arrangement makes it possible to adjust impedance between the pair of fifth signal terminals 620S, improving transmission characteristics of the differential signals transmitted by the fifth signal terminals 620S.

Figure 8A:
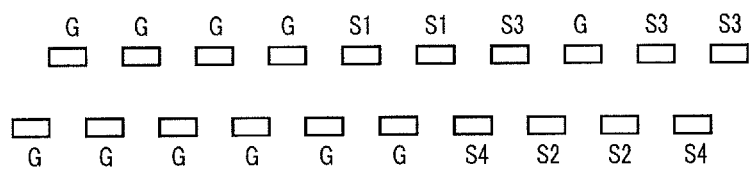
FIG. 8A is an explanatory diagram of a terminal layout of a terminal group according to a first experiment example.

We conducted Experiments 1 and 2. Experiment 1 was conducted on terminals in the first line in the order of G, G, G, G, S1, S1, S3, G, S3, and S3 and terminals in the second line in the order of G, G, G, G, G, G, S4, S2, S2, and S4 as shown in FIG. 8A. The terminals S1 and S1 form a differential pair for high-speed differential signaling. The terminals S2 and S2 also form a differential pair for high-speed differential signaling. The terminal G is a ground terminal. The terminals S3 and S4 are low-speed signal terminals.

Figure 9A:
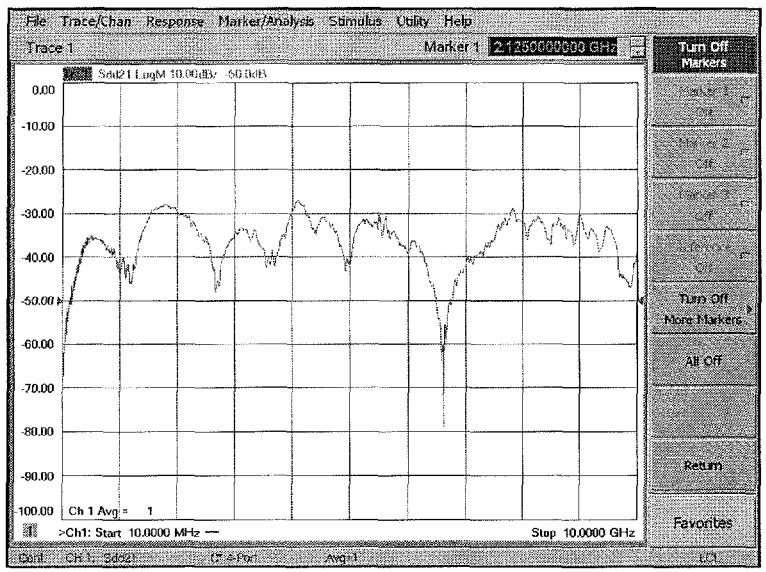
FIG. 9A is a graph illustrating noise characteristics of the first experiment example.

In Experiment 1, we measured noise of the signal terminals S2, with no signals transmitted on the terminals S3 and S4 and with sweep signals at frequencies of 0 to 10 GHz transmitted on the signal terminals S1. The result is shown in the graph of FIG. 9A.

Figure 8B:
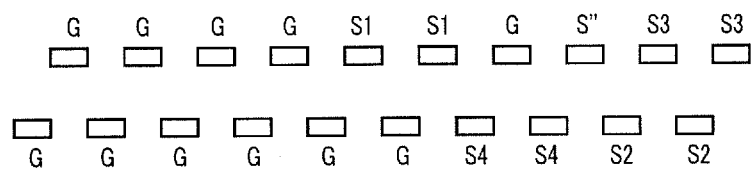
FIG. 8B is an explanatory diagram of a terminal layout of a terminal group of a second experiment example.

Experiment 2 was conducted on terminals in the first line in the order of G, G, G, G, S1, S1, G, S", S3, and S3 and terminals in the second line in the order of G, G, G, G, G, G, S4, S4, S2, and S2 as shown in FIG. 8B. The terminals S1 and S1 form a differential pair for high-speed differential signaling. The terminals S2 and S2 also form a differential pair for high-speed differential signaling. The terminal G is a ground terminal. The terminals S3, S4 and S" are low-speed signal terminals. The terminals S4 may be replaced with ground terminals.

Figure 9B:
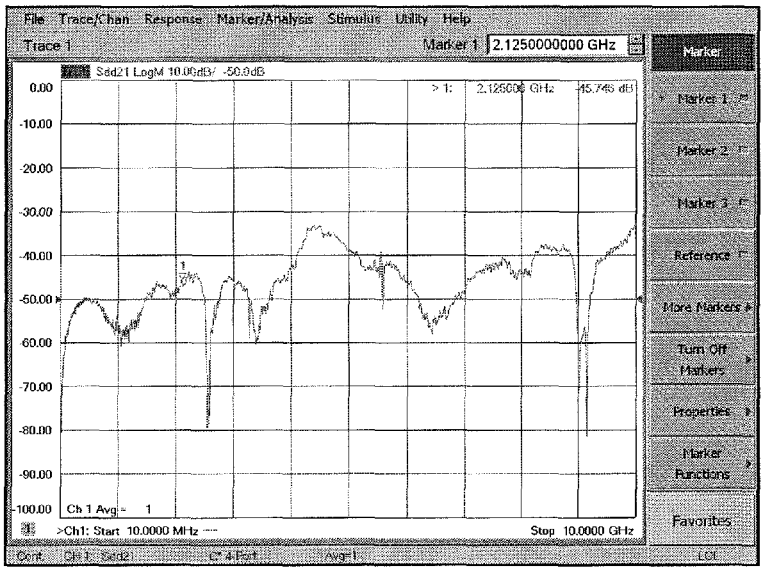
FIG. 9B is a graph illustrating noise characteristics of the second experiment example.

In Experiment 2, we measured noise of the terminals S2 with no signals transmitted on the terminals S3 and S4, with sweep signals at frequencies of 0 to 10 GHz transmitted on the signal terminals S1, and with signals at a frequency of 240 MHz transmitted on the signal terminal S". The result is shown in the graph of FIG. 9B.

Comparing the graphs of Experiments 1 and 2, it is found that there is reduction of noise in Experiment 2 in comparison with Experiment 1. The two terminals S4 are present in the region between the terminals S1 and S2 in Experiment 2, increasing the distance between the terminals S1 and S2 in the X direction. As a result, crosstalk is less likely to occur between the terminals S1 and S2, and the presence of the terminal S'' also contributes to the reduction of crosstalk between the terminals S1 and S2.

Embodiment 4

Figure 10:
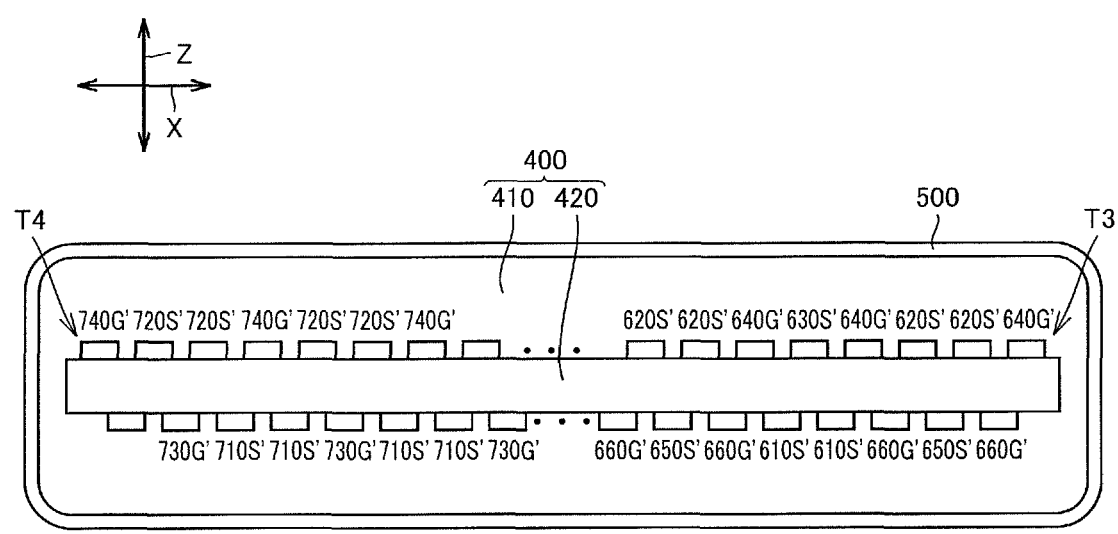
FIG. 10 is a schematic front view of the connector according to Embodiment 4 of the invention.

A connector according to Embodiment 4 of the invention will be described below with reference FIG. 10. The connector shown in FIG. 10 is a receptacle for mounting onto a circuit board (not shown) and receiving a plug (not shown). The connector generally has the same constitution as that of the connector in the Embodiment 3, except that terminal groups T3 and T4 are provided in place of the terminal groups T1 and T2. Only the differences from Embodiment 3 will be described in detail below, and overlapping descriptions will be omitted.

The terminal groups T3 and T4 are compliant with different standards. For example, the terminal groups T3 and T4 may be compliant with any of HDMI standard, USB 3.0 standard and DisplayPort standard. The terminal groups T3 and T4 of the Embodiment 3 will be described below without specifying which standards they are compliant with.

As shown in FIG. 10, the terminal group T3 includes a plurality of fourth signal terminals 610S', a plurality of fifth signal terminals 620S', a sixth signal terminal 630S', a plurality of ground terminals 640G', a plurality of seventh signal terminals 650S', and a plurality of ground terminals 660G'.

The fourth signal terminals 610S', the seventh signal terminals 650S' and the ground terminals 660G' are electrically conductive metal plates extending in the Y direction and have the same shape as that of the fourth signal terminals 610S of Embodiment 3. The fourth signal terminals 610S', the seventh signal terminals 650S' and the ground terminals 660G' each include a middle portion, a contact portion, a hanging portion, and a tail portion. The respective portions of the terminals 610S', 650S', and 660G' will not be described to avoid redundancy with the description of the fourth signal terminals 610S.

The fifth signal terminals 620S', the sixth signal terminal 630S' and the ground terminals 640G' are electrically conductive metal plates extending in the Y direction and have the same shape as the sixth signal terminals 630S of Embodiment 3. The fifth signal terminals 620S', the sixth signal terminal 630S' and the ground terminals 640G' each include a middle portion, a contact portion, a hanging portion, and a tail portion. The respective portions of the terminals 620S', 630S', and 640G' will not be described to avoid redundancy with the description of the sixth signal terminals 630S.

The terminals of the terminal group T3 are arranged in two lines to form a zigzag layout. More particularly, the terminals in the first line (upper row) are arranged at intervals along the X direction in the body 400, in the order of 620S', 620S', 640G', 630S', 640G', 620S', 620S', and 640G', while the terminals in the second line (lower row) are arranged at intervals along the X direction in the body 400, in the order of 660G', 650S', 660G', 610S', 610S', 660G', 650S', and 660G'. The pair of fourth signal terminals 610S' is adjacent to each other in the X direction and forms a differential pair for high-speed differential signaling. One of the ground terminals 640G' and the sixth signal terminal 630S' are adjacent to each other in the X direction. The other ground terminal 640G' and the sixth signal terminal 630S' are adjacent to each other in the X direction. One of the pair of fourth signal terminals 610S' is located in plane position between the one of the ground terminals 640G' and the sixth signal terminal 630S'. In other words, the one of the ground terminals 640G' and the sixth signal terminal 630S' are located on opposite sides of the one of fourth signal terminals 610S' in the X direction in plane position. The other fourth signal terminal 610S' is located between the sixth signal terminal 630S' and the other ground terminal 640G'. In other words, the sixth signal terminal 630S' and the other ground terminal 640G' are located on opposite sides of the other fourth signal terminal 610S' in the X direction in plane position.

The fifth signal terminals 620S' form two differential pairs for high-speed differential signaling, and the terminals of each pair are adjacent to each other in the X direction. In each pair, one of the fifth signal terminals 620S' is located, in plane position, between one of ground terminals 660G' and the seventh signal terminal 650S' that are adjacent to each other in the X direction. In other words, the one of the ground terminals 660G' and the seventh signal terminal 650S' are located on opposite sides of the one of fifth signal terminals 620S' in the X direction in plane position. The other fifth signal terminals 620S' is located in plane position between the seventh signal terminal 650S' and the other ground terminal 660G' that are adjacent to each other in the X direction. In other words, the seventh signal terminal 650S' and the other ground terminal 660G' are located on opposite sides of the other fifth signal terminal 620S' in the X direction in plane position.

A frequency of each signal transmitted by the sixth and seventh signal terminals 630S' and 650S' is about one tenth or lower of a frequency of each high-speed differential signal transmitted by the fourth and fifth signal terminals 610S' and 620S'. For example, the pair of the fourth signal terminals 610S' may transmit high-speed differential signals at a frequency of several GHz to ten-odd GHz, the pairs of fifth signal terminals 620S' may transmit high-speed differential signals also at a frequency of several GHz to ten-odd GHz, and the sixth and seventh signal terminals 630S' and 650S' may transmit signals at a frequency of a few hundred MHz to about one GHz. This configuration makes it possible to use the sixth signal terminal 630S' as a pseudo-ground terminal in plane position between the pair of fourth signal terminals 610S', and to use the seventh signal terminal 650S' as a pseudo-ground terminal in plane position between the pair of fifth signal terminals 620S' in signal transmission. It should also be noted that the sixth and seventh signal terminals 630S' and 650S' exert a signal shielding function (crosstalk reducing function) to lesser degrees than genuine ground terminals.

The terminal group T4 includes a plurality of signal terminals 710S', a plurality of signal terminals 720S', a plurality of ground terminals 730G' and 740G', and other terminals. The terminals of the terminal group T4 are arranged in two lines to form a zigzag layout. More particularly, the terminals in the first line (upper row) are arranged at intervals along the X direction in the body 400, in the order of 740G', 720S', 720S', 740G', 720S', 720S', 740G', and the other terminals, while the terminals in the second line (lower row) are arranged at intervals along the X direction in the body 400, in the order of the other terminals 730G', 710S', 710S', 730G', 710S', 710S', and 730G'.

The signal terminals 720S' and the ground terminals 740G' are electrically conductive metal plates extending in the Y direction and have the same shape as that of the sixth signal terminals 630S. The signal terminals 720S' and the ground terminals 740G' each include a middle portion, a contact portion, a hanging portion, and a tail portion. The respective portions of the terminals 720S' and 740G' will not be described to avoid redundancy with the description of the sixth signal terminals 630S.

The signal terminals 710S' and the ground terminals 730G' are electrically conductive metal plates extending in the Y direction and have the same shape as that of the fourth signal terminals 610S. The signal terminals 710S' and the ground terminals 730G' each include a middle portion, a contact portion, a hanging portion, and a tail portion. The respective portions of the terminals 710S' and 730G' will not be described to avoid redundancy with the description of the fourth signal terminals 610S.

The signal terminals 710S' form two differential pairs for high-speed differential signaling, and the terminals of each pair are adjacent to each other in the X direction. The signal terminals 720S' form two differential pairs for high-speed differential signaling, and the terminals of each pair are adjacent to each other in the X direction. Two of the ground terminals 730G' are each located, in plane position, between adjacent two of the signal terminals 720S'. Two of the ground terminals 740G' are each located, in plane position, between adjacent two of signal terminals 710S'.

The above-described connector has many advantageous features. Particularly, in the terminal group T3, one of ground terminals 640G' and the sixth signal terminal 630S' are located on opposite sides of one of the fourth signal terminals 610S' in the X direction in plane position, and the sixth signal terminal 630S' and the other ground terminal 640G' are located on opposite sides of the other fourth signal terminal 610S' in the X direction in plane position. Further, one of the ground terminals 660G' and one of the seventh signal terminal 650S' are located on opposite sides of one of each pair of the fifth signal terminals 620S' in the X direction in plane position, and the seventh signal terminal 650S' and another one of the ground terminal 660G' are located on opposite sides of the other one of each pair of the fifth signal terminal 620S' in the X direction in plane position. A frequency of each signal transmitted by the sixth and seventh signal terminals 630S' and 650S' is about one tenth or lower of frequency of each high-speed differential signal transmitted by the fourth and fifth signal terminals 610S' and 620S'. This configuration makes it possible to use the sixth signal terminal 630S' as a pseudo-ground terminal between the pair of fourth signal terminals 610S' in plane position, and the seventh signal terminal 650S' as a pseudo-ground terminal between the pair of fifth signal terminals 620S' in plane position in signal transmission. It is therefore possible to reduce crosstalk between differential signals transmitted by the pair of fourth signal terminals 610S' and the differential signals transmitted by the pair of fifth signal terminals 620S'. Also, the sixth and seventh signal terminals 630S' and 650S' can be used as terminals for control signaling or for other low-speed signaling in the connector. Therefore, the connector has a reduced X-direction dimension, i.e. a reduced size in comparison with a case where ground terminals are separately provided between the fourth signal terminals 610S' in plane position and/or between the fifth signal terminals 620S' in plane position.

Embodiment 5

Figure 11:
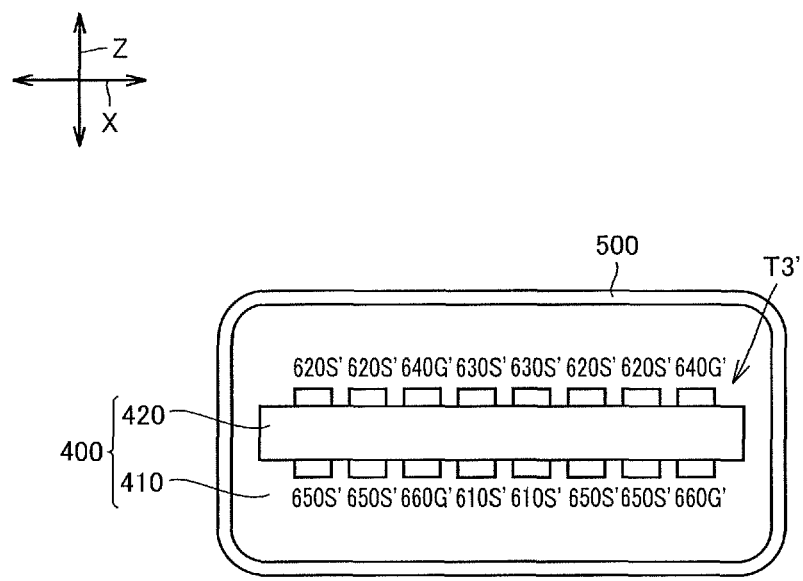
FIG. 11 is a schematic front view of the connector according to Embodiment 5 of the invention.

A connector according to Embodiment 5 of the invention will be described below with reference to FIG. 11. The connector shown in FIG. 11 is a receptacle for mounting onto a circuit board (not shown) and receiving a plug (not shown). The connector generally has the same constitution as the connector of the Embodiment 4, except that the terminal group T4 is not provided and that the terminal layout of the terminal group T3' is different from that of the terminal group T3 of Embodiment 4. Only the differences from Embodiment 4 will be described in detail below, and overlapping descriptions will be omitted. The terminal group of this embodiment is referred to as T3' for the sake of distinction from the terminal group T3 of Embodiment 4.

The body 400 and the shell 500 have the same constitutions as the body 400 and the shell 500 of the Embodiment 4, except the smaller dimensions in the X direction than those of the body 400 and the shell 500 of Embodiment 4.

The terminal group T3' is different from the terminal group T3 in that the terminals are not arranged in two lines to form a zigzag layout. More specifically, the terminals of terminal group T3' are arranged in two lines as shown in FIG. 11. As illustrated, the terminals in the first line (upper row) are arranged in the body 400 at intervals in the X direction, in the order of 620S', 620S', 640G', 630S', 630S' 620S', 620S', and 640G'. The terminals in the second line (lower row) are arranged in the body 400 at intervals in the X direction, in the order of 650S', 650S', 660G', 610S', 610S', 650S', 650S', and 660G'. The terminals in the first and second lines are of the same shape as the terminals in the first and second lines of Embodiment 4.

The pair of fourth signal terminals 610S' is located on the opposite side in the Z direction of a portion of the body 400 (a portion of the main body 410 and the projection 420 of the body 400) from the pair of sixth signal terminals 630S'. The fourth signal terminals 610S' are aligned with the sixth signal terminals 630S' in the Z direction. The pair of fifth signal terminals 620S' is located on the opposite side in the Z direction of the portion of the body 400 (the portion of the main body 410 and the projection 420) from the pair of seventh signal terminals 650S'. The fifth signal terminals 620S' are aligned with the seventh signal terminals 650S' in the Z direction. The ground terminals 640G' are located on the opposite side in the Z direction of the portion of the body 400 (the portion of the main body 410 and the projection 420) from the ground terminals 660G'. The ground terminals 640G' are aligned with the ground terminals 660G in the Z direction.

A frequency of each signal transmitted by the sixth and seventh signal terminals 630S' and 650S' is about one tenth or lower of a frequency of each high-speed differential signal transmitted by the fourth and fifth signal terminals 610S' and 620S. For example, the pair of fourth signal terminals 610S' may transmit high-speed differential signals at a frequency of several GHz to ten-odd GHz, the pairs of fifth signal terminals 620S' may transmit high-speed differential signals also at a frequency of several GHz to ten-odd GHz, and the sixth and seventh signal terminals 630S' and 650S' may transmit signals at a frequency of a few hundred MHz to about one GHz. This configuration makes it possible to use the sixth signal terminals 630S' as pseudo-ground terminals for the fourth signal terminals 610S', and the seventh signal terminals 650S' as pseudo-ground terminals for the fifth signal terminals 620S' in signal transmission. It should also be noted that the sixth and seventh signal terminals 630S' and 650S' exert a signal shielding function (crosstalk reducing function) to lesser degrees than genuine ground terminals.

The above-described connector has many advantageous features. Particularly, in the terminal group T3', the pair of fourth signal terminals 610S' and the pair of sixth signal terminals 630S' are located on the opposite sides in the Z direction of a portion of the body 400, and the pair of fifth signal terminals 620S' and the pair of seventh signal terminals 650S' are located on the opposite sides in the Z direction of the portion of the body 400. A frequency of each signal transmitted by the sixth and seventh signal terminals 630S' and 650S' is about one tenth or lower of a frequency of each high-speed differential signal transmitted by the fourth and fifth signal terminals 610S' and 620S'. This configuration makes it possible to use the pair of sixth signal terminals 630S' as a pseudo-ground terminal for the pair of fourth signal terminals 610S', and the pair of seventh signal terminals 650S' as pseudo-ground terminals for the pairs of fifth signal terminals 620S' in signal transmission. It is therefore possible to reduce crosstalk between differential signals transmitted by the pair of fourth signal terminals 610S' and the differential signals transmitted by the pair of fifth signal terminals 620S'. Also, the sixth and seventh signal terminals 630S' and 650S' can be used as terminals for control signaling or for other low-speed signaling in the connector. Therefore, the connector has a reduced X-direction dimension, i.e. a reduced size in comparison with a case where ground terminals are separately provided on the opposite side of the body 400 from the fourth signal terminals 610S' and/or on the opposite side of the body 400 from the fifth signal terminals 620S'.

The connectors of the invention are not limited to ones according to the above Embodiments and may be modified within the scope of claims. Variants will be described in detail below with reference to FIGS. 12A to 16F.

The connector of Embodiment 1 includes the pair of first signal terminals 310S, the pair of second signal terminals 320S, and the two pieces of third signal terminals 330S, the third signal terminals being arranged at intervals between one of the pair of first signal terminals 310S and one of the pair of second signal terminals 320S in the X direction. However, this first connector of the invention may be modified as long as it includes first, second, and third signal terminals arranged in one line along the first direction in the body, and the third signal terminal is located between the first and second signal terminals, and a frequency of a signal transmitted by the third signal terminal is about one hundredth or lower of a frequency of each signal transmitted by the first and second signal terminals. For example, there may be one, three, or more of third signal terminals provided between the first and second signal terminals. Further, the first connector may include terminals arranged in the body in a plurality of lines along the Z direction (the second direction orthogonal to the first direction). In this case, one of the lines includes the first, second, and third signal terminals arranged in the above described layout, and the remaining terminals may be of any kind and arranged in any manner.

The connector of Embodiment 2 includes the pair of first signal terminals 310S, the pair of second signal terminals 320S, the two ground terminals 340G, and the two third signal terminals 330S, and the ground terminals 340G and the third signal terminals 330S are arranged at intervals along the X direction between one of the first signal terminals 310S and one of the second signal terminals 320S. This second connector of the invention may be modified as long as it includes first, second, and third signal terminals and a ground terminal arranged in a line in the body in the first direction, the third signal terminal and the ground terminal are located between the first and second signal terminals, and a frequency of a signal transmitted by the third signal terminal is about one tenth or lower of a frequency of each signal transmitted by the first and second signal terminals. For example, there may be one ground terminal and one third signal terminal provided between the first and second signal terminals.

Figure 12A:
FIG. 12A is an explanatory diagram illustrating a terminal layout in a first variant of the terminal group in the connector of Embodiment 2.
Figure 12B:
FIG. 12B is an explanatory diagram illustrating a terminal layout in a second variant of the terminal group in the connector of Embodiment 2.

The second connector may be modified as shown in FIG. 12A. Particularly, there may be two ground terminals 340G and one piece of third signal terminal 330S arranged at intervals in the X direction to be located between one of the pair of first signal terminals 310S and one of the pair of second signal terminals 320S in the X direction. The two ground terminals 340G and the one piece of third signal terminal 330S may be arranged in the order of 340G, 330S, 340G. as shown in FIG. 12A. Alternatively, the two ground terminals 340G and the one piece of third signal terminal 330S may be arranged between the first and second signal terminals in the order of 340G, 340G, and 330G or in the order of 330S, 340G, and 340G. Further alternatively, the second connector may be modified as shown in FIG. 12B. Particularly, there may be one ground terminal 340G and two pieces of third signal terminals 330S arranged at intervals in the X direction to be located between one of the pair of first signal terminals 310S and one of the pair of second signal terminals 320S. The one ground terminal 340G and the two pieces of third signal terminal 330S may be arranged in the order of 330S, 340G, 330S as shown in FIG. 12B. Alternatively, the one ground terminal 340G and the two pieces of third signal terminals 330S may be arranged between the first and second signal terminals in the order of 340G, 330S, and 330S or in the order of 330S, 330S, and 340G.

The second connector may also be modified to include a plurality of terminals arranged in the body in a plurality of lines along the Z direction (the second direction). In this case, one of the lines includes the first, second, and third signal terminals and the ground terminal arranged in the above described layout, and the remaining terminals may be of any kind and arranged in any manner.

Figure 13A:
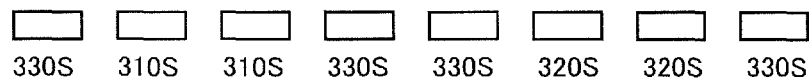
FIG. 13A is an explanatory diagram illustrating a terminal layout in the first variant of the terminal group in the connector of Embodiment 1.
Figure 13B:
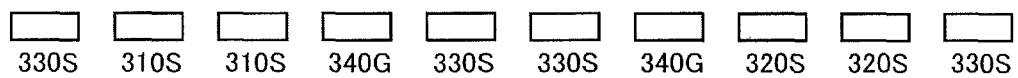
FIG. 13B is an explanatory diagram illustrating a terminal layout in a third variant of the terminal group in the connector of Embodiment 2.
Figure 13C:
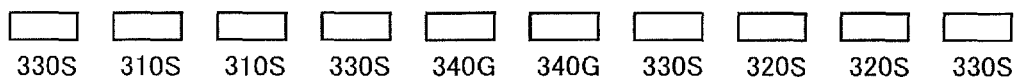
FIG. 13C is an explanatory diagram illustrating a terminal layout in a fourth variant of the terminal group in the connector of Embodiment 2.
Figure 14A:
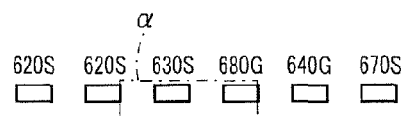
FIG. 14A is an explanatory diagram illustrating a terminal layout in the first variant of a terminal group T1 in the connector of Embodiment 3.
Figure 14B:
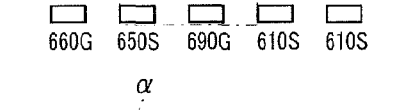
FIG. 14B is an explanatory diagram illustrating a terminal layout in the second variant of the terminal group T1 in the connector of Embodiment 3.
Figure 14C:
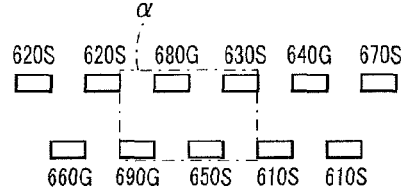
FIG. 14C is an explanatory diagram illustrating a terminal layout in the third variant of the terminal group T1 in the connector of Embodiment 3.
Figure 14D:
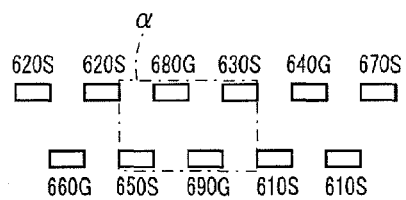
FIG. 14D is an explanatory diagram illustrating an terminal layout in the fourth variant of the terminal group T1 in the connector of Embodiment 3.
Figure 14E:
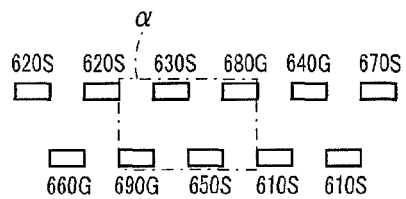
FIG. 14E is an explanatory diagram illustrating a terminal layout in a fifth variant of the terminal group T1 in the connector of Embodiment 3.
Figure 14F:
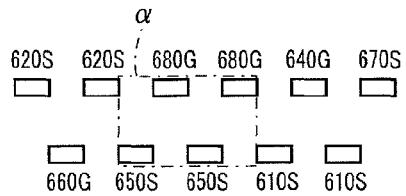
FIG. 14F is an explanatory diagram illustrating a terminal layout in a sixth variant of the terminal group T1 in the connector of Embodiment 3.
Figure 14G:
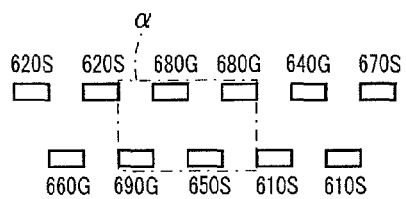
FIG. 14G is an explanatory diagram illustrating a terminal layout in a seventh variant of the terminal group T1 in the connector of Embodiment 3t.
Figure 14H:
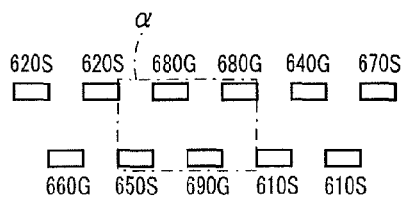
FIG. 14H is an explanatory diagram illustrating a terminal layout in an eighth variant of the terminal group T1 in the connector of Embodiment 3.

In the first and second connectors, the third signal terminal/terminals 330S may be located between one of the first signal terminals 310S and one of the second signal terminals 320S as described above and also at other locations. Particularly, as shown in FIGS. 13A, 13B and 13C, the third signal terminals 330S may be arranged adjacently to the other first signal terminal 310S and the other second signal terminal 320S in the X direction (i.e. adjacently to the endmost ones of the first and second signal terminals in the terminal group along the X direction). Further, in place of the third signal terminals 330S, ground terminals may be provided adjacently to the other first signal terminal 310S and the other second signal terminal 320S in the X direction. By providing the third signal terminals 330S or the ground terminals adjacently to the endmost ones of the first and second signal terminals in the terminal group along the X direction, impedances can be adjusted between the pair of first signal terminals 310S and between the pair of second signal terminals 320S positioned at ends of the terminal group along the X direction.

In Embodiments 1 and 2, the pair of first signal terminals 310S and the pair of second signal terminals 320S form differential pairs. However, the invention may be applied to a connector with at least one first signal terminal and at least one second signal terminal. In other words, the first and second signal terminals may be terminals for single ended-signaling. Alternatively, there may be a pair of first signal terminals for differential signaling and a second signal terminal for single ended signaling, or vice versa. The first, second, and third signal terminals 310S, 320S and 330S and the ground terminal 340G may each include a middle portion, a contact portion, a hanging portion, and a tail portion and may each have a different configuration. For example, the tail portions of the first, second, and third signal terminals and the ground terminal may extend straight down in the Z direction so as to be received in though holes of the circuit board. The first, second, and third signal terminals and the ground terminal may be straight plates extending in the Y direction. The first, second, and third signal terminals and the ground terminal may have the same shape or may have different shapes from each other.

The connector of Embodiment 3 includes the first-line terminals, which are arranged in the body 400 in the order of 620S, 620S, 630S, 630S, 640G, and 670S, and the second-line terminals, which are arranged in the body 400 in the order of 660G, 650S, 650S, 610S, and 610S. However, this third connector may be modified as long as it includes a fourth signal terminal provided in the body; and fifth and sixth signal terminals arranged in a line along a first direction in the body, at a height position that is different from that of the fourth signal terminal, wherein the sixth signal terminal is disposed in a region located between the fourth signal terminal and the fifth signal terminal in the first direction, and a frequency of a signal transmitted by the sixth signal terminal is about one tenth or lower of a frequency of a signal transmitted by the fourth signal terminal.

A possible variant of the third connector is that one or not less than three pieces of sixth signal terminals 630S and/or one or not less than three pieces of seventh signal terminals 650S are provided in the region α between the fourth signal terminal 610S and the fifth signal terminal 620S in the X direction. Other variants are shown in FIGS. 14A to 14D. Particularly, a sixth signal terminal 630S, a seventh signal terminal 650S, a ground terminal 680G (first ground terminal), and a ground terminal 690G (second ground terminal) are disposed in the region α. Other variants are shown in FIGS. 14E to 14H. Particularly, in place of the sixth signal terminal 630S, another ground terminal 680G may be disposed in the region α. The variants shown in FIGS. 14E to 14H may be further modified to dispose one or not less than three pieces of ground terminals 680G in the region α. The connectors of Embodiment 3 and its variants may also be modified such that the tenth signal terminal 670S is replaced with a ground terminal (fifth ground terminal). The ground terminals 640G and 660G may be replaced with eighth and ninth signal terminals. In this case, a frequency of each signal transmitted by the eighth and ninth signal terminals is about one tenth or lower of a frequency of each signal transmitted by the fourth and fifth signal terminals. The seventh signal terminal 650S, the ground terminals 640G and 660G, and the tenth signal terminal 670S may be omitted. The terminal group T2 may be omitted.

Figure 15A:
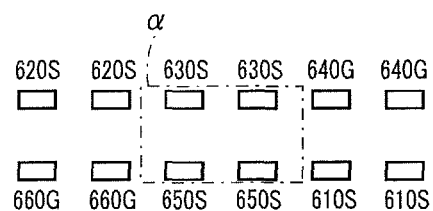
FIG. 15A is an explanatory diagram illustrating a terminal layout in a ninth variant of the terminal group T1 in the connector of Embodiment 3.
Figure 15B:
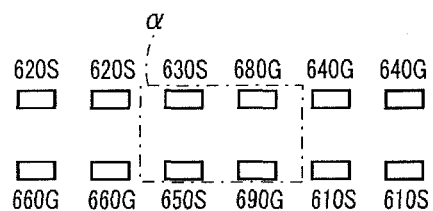
FIG. 15B is an explanatory diagram illustrating a terminal layout in a tenth variant of the terminal group T1 in the connector of Embodiment 3.
Figure 15C:
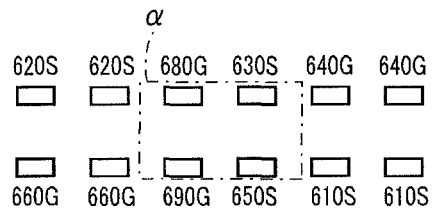
FIG. 15C is an explanatory diagram illustrating a terminal layout in an eleventh variant of the terminal group T1 in the connector of Embodiment 3.

The terminal group T1 of Embodiment 3 may or may not include terminals arranged in two lines into a zigzag layout. A variant of the terminal group T1 is shown in FIG. 15A. Particularly, a pair of fourth signal terminals 610S is disposed on the opposite side of a portion of a body (not shown) from a pair of ground terminals 640G, and a pair of fifth signal terminals 620S is disposed on the opposite side of the portion of the body from a pair of ground terminals 660G. The fourth signal terminals 610S are aligned with the ground terminals 640G in the Z direction (the second direction). Similarly, the fifth signal terminals 620S are aligned with the ground terminals 660G in the Z direction (the second direction). In a region α of this variant, a pair of sixth signal terminals 630S is disposed on the opposite side of the portion of the body from a pair of seventh signal terminals 650S. The sixth signal terminals 630S are aligned with the seventh signal terminals 650S in the Z direction (the second direction). Further variants are shown in FIGS. 15B and 15C. In either of these variants, one of the pair of sixth signal terminals 630S is replaced with a ground terminal 680G, and one of the pair of seventh signal terminals 650S is replaced with a ground terminal 690G in the region α. In any of the variants as shown in FIGS. 15A, 15B, and 15C, at least one of the pair of ground terminals 640G may be replaced with a eighth signal terminal, and at least one of the pair of ground terminals 660G may be replaced with a ninth signal terminal. In this case, a frequency of each signal transmitted by the eighth and ninth signal terminals is about one tenth or lower of a frequency of each signal transmitted by the fourth and fifth signal terminals.

The pair of fourth signal terminals 610S and the pair of fifth signal terminals 620S may form differential pairs. However, at least one fourth signal terminal and at least one fifth signal terminal will suffice. In other words, the fourth and fifth signal terminals may be terminals for single-ended signaling. Alternatively, there may be a pair of fourth signal terminals for differential signaling and a fifth signal terminal for single-ended signaling, or vice versa. In either case, the terminals may have similar layout to ones as shown in FIGS. 15A to 15C, where the fourth signal terminal/terminals 610S may be disposed on the opposite side of the portion of the body from a ground terminal/terminals 640G, and the fifth signal terminal/terminals 620S may be disposed on the opposite side of the portion of the body from a ground terminal/terminals 660G. The fourth signal terminal/terminals 610S may be aligned with the ground terminal/terminals 640G in the Z direction (the second direction). Similarly, the fifth signal terminal/terminals 620S may be aligned with the ground terminal/terminals 660G in the Z direction (the second direction). Also in these cases, at least one of the ground terminals 640G may be replaced with a eighth signal terminal, and at least one of the ground terminals 660G may be replaced with a ninth signal terminal, and a frequency of each signal transmitted by the eighth and ninth signal terminals may be about one tenth or lower of a frequency of each signal transmitted by the fourth and fifth signal terminals.

The fourth, fifth, sixth, seventh and tenth signal terminals 610S, 620S, 630S, 650S, 670S and the ground terminals 640G and 660G may or may not each include a middle portion, a contact portion, a hanging portion, and a tail portion. These terminals may be modified in shape. For example, the tail portions of the fourth, fifth, sixth, seventh and/or tenth signal terminals and/or the ground terminals may extend straight down in the Z direction so as to be received in through holes of the circuit board. The fourth, fifth, sixth, seventh and/or tenth signal terminals and/or the ground terminals may be straight plates extending in the Y direction. The fourth, fifth, sixth, seventh and tenth signal terminals and the ground terminals do not have to have the same shapes and may have different shapes from each other. The fourth signal terminals may be located in the first line, and the fifth and sixth signal terminals may be located in the second line.

The third connector may include terminals arranged in three or more lines along the Z direction (the second direction) in the body. In this case, the fourth signal terminals may be located in any of the lines of terminals, and the fifth and sixth signal terminals may be located in any other line. The remaining terminals may be of any kind and arranged in any manner.

The connector of Embodiment 4 includes the first-line terminals arranged in the body 400 in the order of 620S', 620S', 640G', 630S', 640G', 620S', 620S', and 640G', and the second-line terminals arranged in the body 400 in the order of 660G', 650S', 660G', 610S', 610S', 660G', 650S', and 660G'. However, the arrangement of the terminals may be modified. A fourth connector of the invention may include a fourth signal terminal provided in the body; and a fifth signal terminal and a plurality of sixth signal terminals arranged in a line along a first direction in the body, at a height position that is different from that of the fourth signal terminal, wherein at least two of the sixth signal terminals are adjacent to each other in the first direction, the fourth signal terminal is located in plane position between the two sixth signal terminals in the first direction, and a frequency of each signal transmitted by the sixth signal terminals is about one tenth or lower of a frequency of a signal transmitted by the fourth signal terminal. A fifth connector of the invention may include a fourth signal terminal provided in the body; and a fifth signal terminal, a sixth signal terminal, and a ground terminal arranged in a line along a first direction in the body, at a height position that is different from that of the fourth signal terminal, wherein the sixth signal terminal and the ground terminal are adjacent to each other in the first direction, the fourth signal terminal is arranged in plane position between the sixth signal terminal and the ground terminal, and a frequency of a signal transmitted by the sixth signal terminal is about one tenth or lower of a frequency of a signal transmitted by the fourth signal terminal.

Figure 16A:
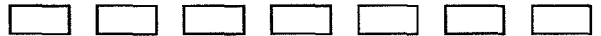
FIG. 16A is an explanatory diagram illustrating a terminal layout in the first variant of a terminal group T3 in the connector of Embodiment 4.
Figure 16B:
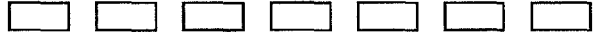
FIG. 16B is an explanatory diagram illustrating a terminal layout in the second variant of the terminal group T3 in the connector of Embodiment 4.

Specific variants of Embodiment 4 are shown in FIGS. 16A to 16F. In the variant as shown in FIG. 16A, one of the fourth signal terminals 610S' forming a differential pair is located in plane position between sixth signal terminals 630S' adjacent to each other in the X direction, and the other fourth signal terminal 610S' is located in plane position between the sixth signal terminals 630S' adjacent to each other in the X direction. In each differential pair, one of the fifth signal terminals 620S' is located in plane position between seventh signal terminals 650S' adjacent to each other in the X direction, and the other fifth signal terminal 620S' is located in plane position between the seventh signal terminals 650S' adjacent to each other in the X direction. In the variant as shown in FIG. 16B, one of the fourth signal terminals 610S' forming a differential pair is located in plane position between a sixth signal terminal 630S' and a ground terminal 640G' adjacent to each other in the X direction, and the other fourth signal terminal 610S' is located in plane position between the ground terminal 640G' and the other sixth signal terminal 630S' adjacent to each other in the X direction. In each differential pair, one of the fifth signal terminals 620S' is located in plane position between the seventh signal terminal 650S' and a ground terminal 660G' adjacent to each other in the X direction, and the other fifth signal terminal 620S' is located in plane position between the ground terminal 660G' and the other seventh signal terminal 650S' adjacent to each other in the X direction.

Figure 16C:
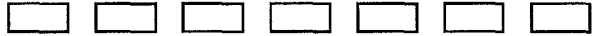
FIG. 16C is an explanatory diagram illustrating a terminal layout in the third variant of the terminal group T3 in the connector of Embodiment 4.
Figure 16D:
FIG. 16D is an explanatory diagram illustrating a terminal layout in the fourth variant of the terminal group T3 in the connector of Embodiment 4.

In the variant as shown in FIG. 16C, one of the fourth signal terminals 610S' forming a differential pair is located in plane position between the sixth signal terminals 630S' adjacent to each other in the X direction, and the other fourth signal terminal 610S' is located in plane position between the sixth signal terminal 630S' and the ground terminal 640G' that are adjacent to each other in the X direction. In each differential pair, one of the fifth signal terminals 620S' is located in plane position between the seventh signal terminals 650S' adjacent to each other in the X direction, and the other fifth signal terminal 620S' is located in plane position between the seventh signal terminal 650S' and the ground terminal 660G' that are adjacent to each other in the X direction. In the variant as shown in FIG. 16D, one of the fourth signal terminals 610S' forming a differential pair is located in plane position between the ground terminal 640G' and the sixth signal terminal 630S' that are adjacent to each other in the X direction, and the other fourth signal terminal 610S' is located in plane position between the sixth signal terminals 630S' adjacent to each other in the X direction. In each differential pair, one of the fifth signal terminal 620S' is located in plane position between the ground terminal 660G' and the seventh signal terminal 650S' that are adjacent to each other in the X direction, and the other fifth signal terminal 620S' is located in plane position between the seventh signal terminals 650S' adjacent to each other in the X direction.

Figure 16E:
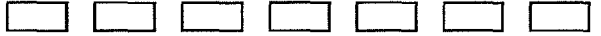
FIG. 16E is an explanatory diagram illustrating a terminal layout in the fifth variant of the terminal group T3 in the connector of Embodiment 4.
Figure 16F:
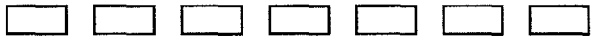
FIG. 16F is an explanatory diagram illustrating a terminal layout in the sixth variant of the terminal group T3 in the connector of Embodiment 4.

In the variant as shown in FIG. 16E, one of fourth signal terminals 610S' forming a differential pair is located in plane position between the ground terminals 640G' adjacent to each other in the X direction, and the other fourth signal terminal 610S' is located in plane position between the ground terminal 640G' and the sixth signal terminal 630S' adjacent to each other in the X direction. In each differential pair, one of the fifth signal terminals 620S' is located in plane position between the seventh signal terminal 650S' and the ground terminal 660G' that are adjacent to each other in the X direction, and the other fifth signal terminal 620S' is located in plane position between the ground terminals 660G' adjacent to each other in the X direction. In the variant as shown in FIG. 16F, one of the signal terminals 610S' forming a differential pair is located in plane position between the sixth signal terminal 630S' and the ground terminals 640G' that are adjacent to each other in the X direction, and the other fourth signal terminal 610S' is located in plane position between the ground terminals 640G' adjacent to each other in the X direction. In each differential pair, one of the fifth signal terminal 620S' is located in plane position between two ground terminals 660G' adjacent to each other in the X direction, and the other fifth signal terminal 620S' is located in plane position between the ground terminal 660G' and the seventh signal terminal 650S' that are adjacent to each other in the X direction. In any connector of Embodiment 4 and its variants as shown in FIGS. 16A to 16F, the seventh signal terminals 650S', the ground terminals 640G', and/or and the ground terminals 660G' may be omitted. Further, the terminal group T4 may also be omitted.

In Embodiment 4 and its variants as described above, the pair of fourth signal terminals 610S' and the pairs of fifth signal terminals 620S' form differential pairs. However, at least one fourth signal terminal and at least one fifth signal terminal will suffice. In other words, the fourth and fifth signal terminals may be terminals for single-ended signaling. Alternatively, there may be a pair of fourth signal terminals for differential signaling and a fifth signal terminal for single ended signaling, and vice versa. When the fourth signal terminal is a terminal for single-ended signaling, it may be located in plane position between the sixth signal terminals adjacent to each other in the first direction or between the sixth signal terminal and a ground terminal adjacent to each other in the first direction.

The fourth and/or fifth connector may include terminals arranged in three or more lines along the Z direction (the second direction) in the body. When the fourth connector takes this arrangement of terminals, the fourth signal terminal may be located in any one of the lines of terminals, and the fifth and sixth signal terminals may be located in any other line as described above. The remaining terminals may be of any kind and arranged in any manner. When the fifth connector takes this arrangement of terminals, the fourth signal terminal may be located in any one of the lines of terminals, and the fifth and sixth signal terminals and the ground terminal may be located in any other line as described above. The remaining terminals may be of any kind and arranged in any manner. Embodiment 4 and its variants as described above may be modified to include terminals arranged in three or more lines.

The connector of Embodiment 5 includes the first-line terminals arranged in the body 400 in the order of 620S', 620S', 640G', 630S', 630S', 620S', 620S', and 640G' and the second-line terminals arranged in the body 400 in the order of 650S', 650S', 660G', 610S', 610S', 650S', 650S', and 660G'. However, this connector may be modified as long as it includes a fourth signal terminal provided in the body; and fifth and sixth signal terminals arranged in a line along a first direction in the body, at a height position that is different from that of the fourth signal terminal. In this case, the fourth signal terminal is located on the opposite side of the portion of the body from the sixth signal terminal and aligned with the sixth signal terminal in the Z direction (the second direction), and a frequency of a signal transmitted by the sixth signal terminal is about one tenth or lower of a frequency of a signal transmitted by the fourth signal terminal (sixth connector).

A possible modification is to replace one of the pair of sixth signal terminals 630S' with a ground terminal. In this case, one of the pair of fourth signal terminals 610S' may be located on the opposite side of the portion of the body from the sixth signal terminal 630S', and the other fourth signal terminal 610S' may be located on the opposite side of the portion of the body from the ground terminal. The one of the fourth signal terminals 610S' may be aligned with the sixth signal terminal 630S' in the Z direction (the second direction), and the other fourth signal terminals 610S' may be aligned with the ground terminal in the Z direction (the second direction). Similarly, one of each pair of seventh signal terminals 650S' may be replaced with a ground terminal. In this case, one of the fifth signal terminals 620S' may be located on the opposite side of the portion of the body from a seventh signal terminal 650S', and the other of the pair is on the opposite side of the portion of the body from a ground terminal. The one of the fifth signal terminals 620S' may be aligned with the seventh signal terminal 650S' in the Z direction (the second direction), and the other fifth signal terminals 620S' may be aligned with the ground terminal in the Z direction (the second direction).

In the Embodiment 5 and its variants as described above, the pair of fourth signal terminals 610S' and the pairs of fifth signal terminals 620S' form differential pairs. However, at least one fourth signal terminal and at least one fifth signal terminal will suffice. In other words, the fourth and fifth signal terminals may be terminals for single-ended signaling. Alternatively, there may be a pair of fourth signal terminals for differential signaling and a fifth signal terminal for single ended signaling, and vice versa. When the fourth signal terminal is a terminal for single-ended signaling, it may be located on the opposite side of a portion of the body from a sixth signal terminal, and the fourth signal terminal may be aligned with the sixth signal terminal in the Z direction (the second direction).

The fourth, fifth and sixth signal terminals 610S', 620S', 650S' and the ground terminals 640G', 660G' may or may not each include a middle portion, a contact portion, a hanging portion, and a tail portion. These terminals may be modified in shape. For example, the tail portions of the fourth, fifth and/or sixth signal terminals and/or the ground terminals may extend straight down in the Z direction so as to be received in through holes of the circuit board. Further, the fourth, fifth and/or sixth signal terminals and/or the ground terminals may be straight plates extending in the Y direction. The fourth, fifth and sixth signal terminals and the ground terminals do not have to have the same shapes, and may have different shapes from each other. The fourth signal terminals may be located in the first line, and the fifth and sixth signal terminals may be located in the second line.

The sixth connector may include terminals arranged in three or more lines along the Z direction (the second direction) in the body. In this case, the fourth signal terminals may be located in any of the lines of terminals, and the fifth and sixth signal terminals may be located in any other line as described above. The remaining terminals may be of any kind and arranged in any manner.

In Embodiments 1 to 5, the body includes the main body and the projection. However, the body may be of any configuration adapted to hold the above-described terminals. Specifically, the terminals may be partially embedded in the body by insert molding or may be press-fitted in holes or grooves of the body.

Lastly, the material, shapes, sizes, numbers, and arrangements constituting the respective components of the connector according to Embodiments 1 to 5 and their modifications have been described by way of example only and may be modified in any manner if they perform the same functions. The connectors of the invention may be receptacles or plugs. A plug connector of the invention may include of the above-described signal terminals with their tails portions connected directly to core wires of a cable, or indirectly connected to them, i.e. the tail portions may be connected to a circuit board that is connected to a cable.

| REFERENCE SIGNS LIST | |
|---|---|
| 100 | body |
| 110 | main body |
| 120 | convex portion |
| 200 | shell |
| T | terminal group |
| 310S | first signal terminal |
| 320S | second signal terminal |
| 330S | third signal terminal |
| T' | terminal group |
| 310S | first signal terminal |
| 320S | second signal terminal |
| 330S | third signal terminal |
| 340G | ground terminal |
| 400 | body |
| 410 | main body |
| 420 | convex portion |
| 500 | shell |
| T1 | terminal group |
| 610S | fourth signal terminal |
| 620S | fifth signal terminal |
| 630S | sixth signal terminal |
| 640G | ground terminal (third ground terminal) |
| 650S | seventh signal terminal |
| 660G | ground terminal (fourth ground terminal) |
| 670S | tenth signal terminal |
| 680G | ground terminal (first ground terminal) |
| 690G | ground terminal (second ground terminal) |
| T2 | terminal group |
| 710S | signal terminal |
| 720S | signal terminal |
| 730G | ground terminal |
| 740G | ground terminal |
| T3, T3' | terminal group |
| 610S' | fourth signal terminal |
| 620S' | fifth signal terminal |
| 630S' | sixth signal terminal |
| 640G' | ground terminal |
| 650S' | seventh signal terminal |
| 660G' | ground terminal |
| T4 | terminal group |
| 710S' | signal terminal |
| 720S' | signal terminal |
| 730G' | ground terminal |
| 740G' | ground terminal |
| X | X direction (first direction) |
| Z | Z direction (second direction) |

The invention claimed is:

1. A connector, comprising:
a body of insulating material; and
first, second, and third signal terminals arranged in a line along a first direction in the body, wherein
the third signal terminal is located between the first and second signal terminals,
a frequency of a signal transmitted by the third signal terminal is about one hundredth or lower of a frequency of each signal transmitted by the first and second signal terminals.

2. The connector according to claim 1, wherein the third signal terminal comprises a plurality of third signal terminals located between the first and second signal terminals in the first direction.

3. A connector, comprising:
a body of insulating material; and
first, second, and third signal terminals and a ground terminal arranged in a line along a first direction in the body, wherein
the third signal terminal and the ground terminal are located between the first and second signal terminals,
a frequency of a signal transmitted by the third signal terminal is about one tenth or lower of a frequency of each signal transmitted by the first and second signal terminals.

4. The connector according to claim 3, wherein
the ground terminal comprises at least two ground terminals, one of which is located between the first and third signal terminals in the first direction, and another of which is located between the second and third signal terminals in the first direction.

5. The connector according to claim 3, wherein
the third signal terminal comprises at least two third signal terminals, one of which is located between the first signal terminal and the ground terminal in the first direction, and another of which is located between the second signal terminal and the ground terminal in the first direction.

6. The connector according to claim 1, wherein
the first signal terminal comprises a pair of first signal terminals arranged adjacent to each other in the first direction.

7. The connector according to claim 2, wherein
the first signal terminal comprises a pair of first signal terminals arranged adjacent to each other in the first direction.

8. The connector according to claim 3, wherein
the first signal terminal comprises a pair of first signal terminals arranged adjacent to each other in the first direction.

9. The connector according to claim 4, wherein
the first signal terminal comprises a pair of first signal terminals arranged adjacent to each other in the first direction.

10. The connector according to claim 5, wherein
the first signal terminal comprises a pair of first signal terminals arranged adjacent to each other in the first direction.

11. The connector according to claim 6, wherein
the second signal terminal comprises a pair of second signal terminals arranged adjacent to each other in the first direction.

12. The connector according to claim 7, wherein
the second signal terminal comprises a pair of second signal terminals arranged adjacent to each other in the first direction.

13. The connector according to claim 8, wherein
the second signal terminal comprises a pair of second signal terminals arranged adjacent to each other in the first direction.

14. The connector according to claim 9, wherein
the second signal terminal comprises a pair of second signal terminals arranged adjacent to each other in the first direction.

15. The connector according to claim 10, wherein
the second signal terminal comprises a pair of second signal terminals arranged adjacent to each other in the first direction.

16. The connector according to claim 11, wherein
the pair of first signal terminals forms a differential pair, and
the pair of second signal terminals forms a differential pair.

17. The connector according to claim 12, wherein
the pair of first signal terminals forms a differential pair, and
the pair of second signal terminals forms a differential pair.

18. The connector according to claim 13, wherein
the pair of first signal terminals forms a differential pair, and
the pair of second signal terminals forms a differential pair.

19. The connector according to claim 14, wherein
the pair of first signal terminals forms a differential pair, and
the pair of second signal terminals forms a differential pair.

20. The connector according to claim 15, wherein
the pair of first signal terminals forms a differential pair, and
the pair of second signal terminals forms a differential pair.

* * * * *